(12) United States Patent
Takai et al.

(10) Patent No.: US 7,964,289 B2
(45) Date of Patent: Jun. 21, 2011

(54) FORMATION METHOD OF METAL LAYER ON RESIN LAYER, PRINTED WIRING BOARD, AND PRODUCTION METHOD THEREOF

(75) Inventors: Kenji Takai, Oyma (JP); Norio Moriike, Shimodate (JP); Kenichi Kamiyama, Shimodate (JP); Katsuyuki Masuda, Shimodate (JP); Kiyoshi Hasegawa, Yuki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/614,267

(22) Filed: Nov. 6, 2009

(65) Prior Publication Data

US 2010/0044086 A1    Feb. 25, 2010

Related U.S. Application Data

(62) Division of application No. 10/986,913, filed on Nov. 15, 2004, now Pat. No. 7,615,277.

(30) Foreign Application Priority Data

| Nov. 14, 2003 | (JP) | P2003-385852 |
| Nov. 14, 2003 | (JP) | P2003-385853 |
| Jan. 27, 2004 | (JP) | P2004-018139 |
| Jan. 30, 2004 | (JP) | P2004-024400 |
| Jan. 30, 2004 | (JP) | P2004-024422 |

(51) Int. Cl.
*B32B 3/00* (2006.01)

(52) U.S. Cl. ........ 428/612; 428/209; 428/615; 428/617; 428/618; 428/621

(58) Field of Classification Search .................. 428/209, 428/612, 687, 615, 617, 618, 621
See application file for complete search history.

(56) References Cited

U.S. PATENT DOCUMENTS

| 2,897,186 | A |   | 7/1959  | Miller |
| 3,932,689 | A |   | 1/1976  | Watanabe et al. |
| 3,955,024 | A |   | 5/1976  | Goldman et al. |
| 3,986,939 | A | * | 10/1976 | Prest ............ 205/162 |
| 4,081,601 | A | * | 3/1978  | Dinella et al. ...... 174/257 |
| 4,421,827 | A |   | 12/1983 | Phillips |
| 4,521,491 | A |   | 6/1985  | Oizumi et al. |

(Continued)

FOREIGN PATENT DOCUMENTS

EP    0 637 902 A1    2/1995

(Continued)

OTHER PUBLICATIONS

Japanese Official Action dated Sep. 16, 2008, for Application No. 2004-02400.

(Continued)

*Primary Examiner* — Cathy Lam
(74) *Attorney, Agent, or Firm* — Antonelli, Terry, Stout & Kraus, LLP.

(57) ABSTRACT

A printed wiring board having a conductor circuit comprising a copper layer adjacent to an insulating layer and an electroless gold plating, wherein the insulating layer has ten-point mean surface roughness (Rz) of 2.0 μm or less is provided. According to the present invention, there is no such a defect that gold plating is deposited on a resin, and fine wiring formation with accuracy is realized.

21 Claims, 5 Drawing Sheets

U.S. PATENT DOCUMENTS

| | | | |
|---|---|---|---|
| 4,751,146 | A | 6/1988 | Maeda et al. |
| 5,356,526 | A * | 10/1994 | Frankenthal et al. ......... 205/122 |
| 5,439,986 | A | 8/1995 | Hosogane et al. |
| 5,538,789 | A | 7/1996 | Capote et al. |
| 5,541,366 | A | 7/1996 | Maoz et al. |
| 5,670,250 | A | 9/1997 | Sanville et al. |
| 5,829,124 | A * | 11/1998 | Kresge et al. .................... 29/840 |
| 6,130,476 | A * | 10/2000 | LaFontaine et al. ......... 257/678 |
| 6,331,347 | B2 * | 12/2001 | Haji ............................. 428/209 |
| 6,359,233 | B1 * | 3/2002 | Joy et al. ....................... 174/255 |
| 6,403,221 | B1 | 6/2002 | Nakamura et al. |
| 6,815,126 | B2 * | 11/2004 | Fey et al. ........................... 430/9 |
| 6,994,918 | B2 * | 2/2006 | Johnson ........................ 428/618 |
| 7,405,484 | B2 * | 7/2008 | Usui et al. .................... 257/776 |

FOREIGN PATENT DOCUMENTS

| | | |
|---|---|---|
| JP | 02-277297 | 11/1990 |
| JP | 04-182466 | 6/1992 |
| JP | 05-009254 | 1/1993 |
| JP | 06-116517 | 4/1994 |
| JP | 07-221444 | 8/1995 |
| JP | 08-021618 | 1/1996 |
| JP | 08-193188 | 7/1996 |
| JP | 08-309918 | 11/1996 |
| JP | 09-246720 | 9/1997 |
| JP | 10-004254 | 1/1998 |
| JP | 10-200259 | 7/1998 |
| JP | 10-242638 | 9/1998 |
| JP | 11-124452 | 5/1999 |
| JP | 11-130831 | 5/1999 |
| JP | 11-140659 | 5/1999 |
| JP | 11-217503 | 8/1999 |
| JP | 2000-198855 | 7/2000 |
| JP | 2000-282265 | 10/2000 |
| JP | 2000-307245 | 11/2000 |
| JP | 2001-244639 | 9/2001 |
| JP | 2002-137328 | 5/2002 |
| JP | 2002-314243 | 10/2002 |
| JP | 2003-069233 | 3/2003 |
| JP | 2003-152317 | 5/2003 |
| JP | 2003-158364 | 5/2003 |
| JP | 2003-229648 | 8/2003 |
| JP | 2001-302795 | 10/2003 |
| JP | 2004-047680 | 2/2004 |
| JP | 2005-053218 | 3/2005 |
| JP | 2005053218 | 3/2006 |
| WO | WO 03/074268 A1 | 9/2003 |
| WO | WO 2005-009093 A1 | 1/2005 |

OTHER PUBLICATIONS

Japanese Official Action dated Sep. 16, 2008, for Application No. 2004-018139.

Korean Official Action dated Apr. 26, 2006, for Application No. 10-2004-92210.

Japanese Official Action dated Nov. 13, 2007, for Application No. 2004-024422.

Japanese Official Action dated Feb. 19, 2008, for Application No. 2004-024422.

Japanese Official Action dated Mar. 24, 2009, for Application No. 2004-018139.

Japanese Official Action dated Mar. 24, 2009, for Application No. 2004-024400.

Japanese Official Action dated May 25, 2010, for Application No. 2008-109192.

Japanese Official Action dated May 25, 2010, for Application No. 2008-109200.

Japanese Official Action dated Sep. 14, 2010, for JP Application No. 2008-109188.

Japanese Official Action dated Sep. 14, 2010, for JP Application No. 2008-109192.

Japanese Official Action dated Sep. 14, 2010, for JP Application No. 2008-109200.

* cited by examiner

FORMATION METHOD OF METAL LAYER ON RESIN LAYER, PRINTED WIRING BOARD, AND PRODUCTION METHOD THEREOF

This application is a Divisional application of application Ser. No. 10/986,913, filed Nov. 15, 2004, now U.S. Pat. No. 7,615,277 the contents of which are incorporated herein by reference in their entirety.

BACKGROUND OF THE INVENTION

1. Field of the Invention

The invention relates to a printed wiring board and its production method. Further, the invention relates to a formation method of a resin layer on a metal layer, an inner conductor circuit treatment method, and a multilayer circuit board.

2. Description of the Related Art

Recently, electronic devices have been required to be compact, lightweight and high speed, and high densification of printed wiring boards has been advanced. Along with that, production of a printed wiring board by a semi-additive method using electroplating has been drawing an attention. As a semi-additive method, Japanese Patent Application Laid-Open No. 10-4254 discloses a method involving forming holds to be IVH in the resin surface in which a circuit is to be formed by laser; surface-roughening the resin surface with several μm by chemical roughening or plasma treatment; supplying a Pd catalyst; carrying out electroless plating in about 1 μm-thickness, forming a resist layer for pattern electroplating, carrying out wiring formation by pattern electroplating, and then removing the resist and a power supply layer existing in the portion other than the circuit and in such a manner the method makes more finer wiring formation possible as compared with a subtractive method with a high side etching degree. Japanese Patent Application Laid-Open No. 2003-158364 discloses a method of forming a circuit using a separable metal foil with a thickness of 5 μm or thinner formed on a supporting metal foil. The method makes production of a printed wiring board with a high reliability possible without requiring electroless plating of the surface of an insulating resin layer. However, according to these methods, the roughened shape inversely interferes the fine wiring formation. Moreover, the electric characteristics are deteriorated by the roughened shape. Japanese Patent Application Laid-Open (JP-A) No. 7-221444 discloses a method involving forming a copper layer with about 1 μm thickness on one face of a polyimide film by using an electron beam evaporation apparatus and layering the layer on an intermediate circuit by an adhesive or a prepreg to form an electric power supply layer. However, the substrate is very expensive and thus does not become popular.

After formation of the circuit in such a manner, gold plating on the outermost layer of the substrate is sometimes carried out. JP-A No. 7-221444 discloses a method of electrolytic gold plating to improve the connection reliability of terminals of a substrate and a semiconductor chip. As the gold plating method, there are an electroless gold plating method and an electrolytic gold plating method. Between them, the electroless gold plating method which requires no electric power supply is advantageous in high densification. However, in the case of gold plating after the circuit formation, a trouble that the gold plating is deposited on the resin sometimes occurs at the time of electroless gold plating according to the above-mentioned method disclosed in JP-A No. 10-4254. Especially, in the case the wiring pitches become 80 μm or narrower, the trouble occurs more frequently. Also, in the case of gold plating after the circuit formation, a trouble that the gold plating is deposited on the resin sometimes occurs owing to remaining of a copper foil on the resin at the time of electroless gold plating according to the above-mentioned method disclosed in JP-A No. 2003-158364.

Further, in recent years, to satisfy high densification of a substrate and speed up of signal transmission, built up type multilayer wiring boards have been used. JP-A No. 10-242638 discloses a method involving surface roughening a conductor circuit of a core substrate with a copper-nickel-phosphorus alloy, forming an insulating layer thereafter, and forming a conductor circuit on the insulating layer. JP-A No. 2000-282265 discloses a method of roughening in micron order the copper surface by using an aqueous solution containing an inorganic acid and a copper-oxidizing agent as main agents and at least one kind azole and etching suppressing agent as auxiliary agents. JP-A No. 9-246720 discloses a method involving forming continuous projected and recessed parts with height in a range of 1.5 to 5.0 μm by micro-etching and carrying out chromation and treatment with a coupling agent. As described, there are many methods for treating conductive circuits, and the methods can be divided broadly into methods of covering copper with an anti-rust treatment metal other than copper, methods of forming the roughened surface in micron order by roughening the conductor surface by etching or plating, and combination of these methods.

Along with the high densification of the substrate, the wiring has been made finer. Presently, it is highly required to form wiring with L/S=20/20 μm or lower by fine wiring formation techniques represented by the semi-additive method.

However, these methods tend to cause problems that the electric properties are deteriorated: that plating is deposited on the portion other than the conductor circuits along with the advanced fineness of the circuits: and that plating between fine circuits is insufficient. Further, there occur problems that the resistance of the conductor is increased because of etching of the conductor circuit and the dispersion of the wiring becomes wide.

SUMMARY OF THE INVENTION

The embodiments of the invention are the following (1A) to (17A).

(1A) A printed wiring board having a conductor circuit comprising a copper layer adjacent to an insulating layer and an electroless gold plating, wherein the insulating layer has ten-point mean surface roughness (Rz) of 2.0 μm or less.

(2A) The printed wiring board according to (1A), wherein the copper layer has a double-layer structure comprising a copper foil and electrolytic copper plating.

(3A) The printed wiring board according to (1A), wherein the copper layer has a triple-layer structure comprising a copper foil, an electroless copper plating, and an electrolytic copper plating.

(4A) A printed wiring board having a conductor circuit comprising a copper layer adjacent to an insulating layer and an electroless gold plating, wherein the face of the copper foil contacting the insulating layer is not practically surface-roughened.

(5A) The printed wiring board according to (4A), wherein the copper layer has a double-layer structure comprising a copper foil and electrolytic copper plating.

(6A) The printed wiring board according to (4A), wherein the copper layer has a triple-layer structure comprising a copper foil, an electroless copper plating, and an electrolytic copper plating.
(7A) The printed wiring board according to one of (2A), (3A), (5A), and (6A), wherein the electrolytic copper plating is formed by patterned electrolytic copper plating.
(8A) The printed wiring board according to one of (1A) to (7A), wherein an electroless nickel plating exists immediately under the electroless gold plating.
(9A) The printed wiring board according to one of (1A) to (8A), wherein the minimum pitch of the conductor circuit is 80 μm or narrower.
(10A) A production method of a printed wiring board involving forming a circuit on a substrate which has a copper foil on an insulating layer and carrying out electroless gold plating on the circuit, wherein the face of the copper foil contacting the insulating layer has ten-point mean surface roughness (Rz) of 2.0 μm or less.
(11A) A production method of a printed wiring board involving forming a circuit on a substrate which has a copper foil on an insulating layer and carrying out electroless gold plating on the circuit, wherein the face of the copper foil contacting the insulating layer is not practically surface-roughened.
(12A) The production method of a printed wiring board according to (10A) or (11A) including steps of forming holes penetrating the insulating layer and the copper foil for interlayer connection, carrying out electroless copper plating in the holes and on the copper foil, forming a resist layer on the portion where no conductor circuit is to be formed, carrying out patterned electrolytic copper plating in the holes and on the copper foil, removing the resist layer, and removing the copper foil and the electroless copper plating in the portions other than the portion to be the conductor circuit by etching.
(13A) The production method of a printed wiring board according to (12A), wherein the step of removing the portions other than the portion to be the conductor circuit by etching is carried out by etching with a chemical solution containing sulfuric acid and hydrogen peroxide as main components.
(14A) The production method of a printed wiring board according to (13A), wherein the concentration of sulfuric acid is 5 to 300 g/L and the concentration of hydrogen peroxide is 5 to 200 g/L.
(15A) The production method of a printed wiring board according to one of (10A) to (14A) involving electroless nickel plating before electroless gold plating.
(16A) The production method of a printed wiring board according to one of (10A) to (15A) involving electroless palladium plating before electroless gold plating.
(17A) The production method of a printed wiring board according to one of (10A) to (16A), wherein the minimum pitch of the conductor circuit is 80 μm or narrower.

According to the above embodiments of the invention, there is no such a defect that gold plating is deposited on a resin, and fine wiring formation with accuracy is realized.

Further, the embodiments of the invention are the following (1B) to (20B).
(1B) A printed wiring board comprising an insulating layer and a conductor circuit, wherein a part of the conductor circuit is made of an electrolytic copper foil and the surface in the inner layer side of the conductor circuit has ten-point mean surface roughness (Rz) of 2.0 μm or less and an adhesive layer is inserted between the conductor circuit and the insulating layer.
(2B) The printed wiring board according to (1B), wherein the thickness of the adhesive layer is 0.1 to 5 μm.
(3B) The printed wiring board according to (1B) or (2B), wherein the thickness of the adhesive layer is 1/8 or thinner than the thickness of the insulating layer.
(4B) The printed wiring board according to one of (1B) to (3B), wherein the adhesive layer contains an organic material and an the insulating layer comprises a composite material of an inorganic material and an organic material.
(5B) The printed wiring board according to one (1B) to (4B), wherein the conductor circuit is entirely covered with the adhesive layer.
(6B) The printed wiring board according to one of (1B) to (5B), wherein the entire body of the conductor circuit is not substantially surface-roughened.
(7B) The printed wiring board according to one of (1B) to (6B), wherein a resin having 20 ppm/° C. or lower thermal expansion coefficient in the transverse direction (CTE X, CTE Y) in a range of 0 to 150° C. is used for the insulating layer.
(8B) The printed wiring board according to one of (1B) to (7B), wherein a resin having a tensile strength of 200 MPa or higher at 20° C. is used for the insulating layer.
(9B) The printed wiring board according to one of (1B) to (8B), wherein a resin having a dielectric dissipation factor of 0.01 or lower at 1 GHz is used for the insulating layer.
(10B) The printed wiring board according to one of (1B) to (9B), wherein a resin having a dielectric constant of 0.3 or lower at 1 GHz is used for the insulating layer.
(11B) The printed wiring board according to one of (1B) to (10B), wherein a thermosetting resin composition containing (A) polyphenylene ether or a modified polyphenylene ether is used for the insulating layer.
(12B) The printed wiring board according to one of (1B) to (11B), wherein (B) a thermosetting resin composition containing a cyanate ester compound is used for the insulating layer.
(13B) The printed wiring board according to one of (1B) to (12B), wherein (C) a thermosetting resin composition containing an epoxy compound is used for the insulating layer.
(14B) The printed wiring board according to one of (1B) to (13B), wherein (D) a thermosetting resin composition containing a polyamide imide compound is used for the insulating layer.
(15B) The printed wiring board according to one of (1B) to (14B), wherein the peel strength of the insulating layer and the conductor circuit with 1 mm width is 0.6 kN/m or higher.
(16B) The printed wiring board according to one of (1B) to (15B), wherein the peel strength of the insulating layer and the conductor circuit with 1 mm width is 0.4 kN/m or higher after heating at 150° C. for 240 hours.
(17B) A production method of a printed wiring board involving forming a conductor circuit by patterned electroplating using a metal foil firmly fixed on an insulating layer as an electric power supply layer, wherein the metal foil is not surface-roughened in both faces and an adhesive layer is inserted between the insulating resin and the metal foil.
(18B) The production method of a printed wiring board according to (17B), wherein the metal foil has ten-point mean surface roughness (Rz) of 2.0 μm or less in both faces.
(19B) The production method of a printed wiring board according to (17B) or (18B), wherein the metal foil has a thickness of 3 μm or thinner.
(20B) The production method of a printed wiring board according to one of (17B) to (19B), wherein an electroless plating layer is formed on the metal foil.

According to the above-mentioned embodiments, a wiring board advantageous in the fine wiring formation, electric properties, and production cost can be obtained and a wiring board excellent in high frequency properties can be obtained as well.

Further, embodiments of the invention are following (1C) to (16C).

(1C) A formation method of a resin layer on a metal by forming a thin film of a polyamide imide on the metal as adhesion promoting treatment and then coating the metal with the resin.

(2C) The formation method of a resin layer on a metal according to (1C), wherein the thickness of the polyamide imide layer is 0.1 to 5 μm.

(3C) The formation method of a resin layer on a metal according to (1C) or (2C), wherein the metal is copper.

(4C) The formation method of a resin layer on a metal according to one of (1C) to (3C), wherein the polyamide imide layer is formed directly on copper without any practical surface roughening treatment.

(5C) An inner conductor circuit treatment method involving forming a polyamide imide layer as an adhesion promoting agent on a core substrate bearing a conductor circuit.

(6C) The inner conductor circuit treatment method according to (5C), wherein the thickness of the polyamide imide layer is 0.1 to 5 μm.

(7C) The inner conductor circuit treatment method according to (5C) or (6C), wherein the polyamide imide layer is formed by immersing the core substrate bearing the conductor circuit in a polyamide imide solution.

(8C) The inner conductor circuit treatment method according to (7C), wherein after immersion to the polyamide imide solution, the polyamide imide is set in B stage state by drying until the remaining solvent is decreased to 1% or less.

(9C) The inner conductor circuit treatment method according to one of (5C) to (8C), wherein the conductor circuit is made of copper and the polyamide imide layer is formed directly on the copper without any practical surface-roughening treatment.

(10C) The inner conductor circuit treatment method according to one of (5C) to (9C), wherein the conductor circuit has ten-point mean surface roughness (Rz) of 2.0 μm or less.

(11C) The inner conductor circuit treatment method according to one of (5C) to (10C), wherein the insulating layer contained in the core substrate has ten-point mean surface roughness (Rz) of 2.0 μm or less.

(12C) The inner conductor circuit treatment method according to one of (5C) to (11C), wherein a polyamide imide provided with high moisture absorbing and heat resistant properties by comprising a saturated hydrocarbon as a unit component is used.

(13C) The inner conductor circuit treatment method according to one of (5C) to (12C) involving forming an insulating layer on the core substrate subjected to the inner conductor circuit treatment.

(14C) The inner conductor circuit treatment method according to (13C), wherein the insulating layer contains at least an epoxy resin.

(15C) The inner conductor circuit treatment method according to (13C) or (14C), wherein the insulating layer is made of prepreg.

(16C) A multilayer wiring board comprising wiring, a polyamide imide resin layer and an insulating layer, wherein the wiring is inside of the multilayer wiring board, the insulating layer is an outer layer which contacts the wiring via the polyamide imide resin layer.

According to the embodiments, an inner conductor circuit treatment method capable of providing excellent electric properties and suppressing dispersion of wiring and occurrence of defection is provided.

The present disclosure relates to subject matter contained in Japanese Patent Application No. 2003-385852 filed on Nov. 14, 2003, No. 2003-385853 filed on Nov. 14, 2003, No. 2004-018139 filed on Jan. 27, 2004, No. 2004-024400 filed on Jan. 30, 2004, No. 2004-024422 filed on Jan. 30, 2004, the disclosure of which is expressly incorporated herein by reference in its entirety.

DESCRIPTION OF THE PREFERRED EMBODIMENTS

Hereinafter, the embodiments of the invention will be described in detail with reference to drawings.

Figure 1:
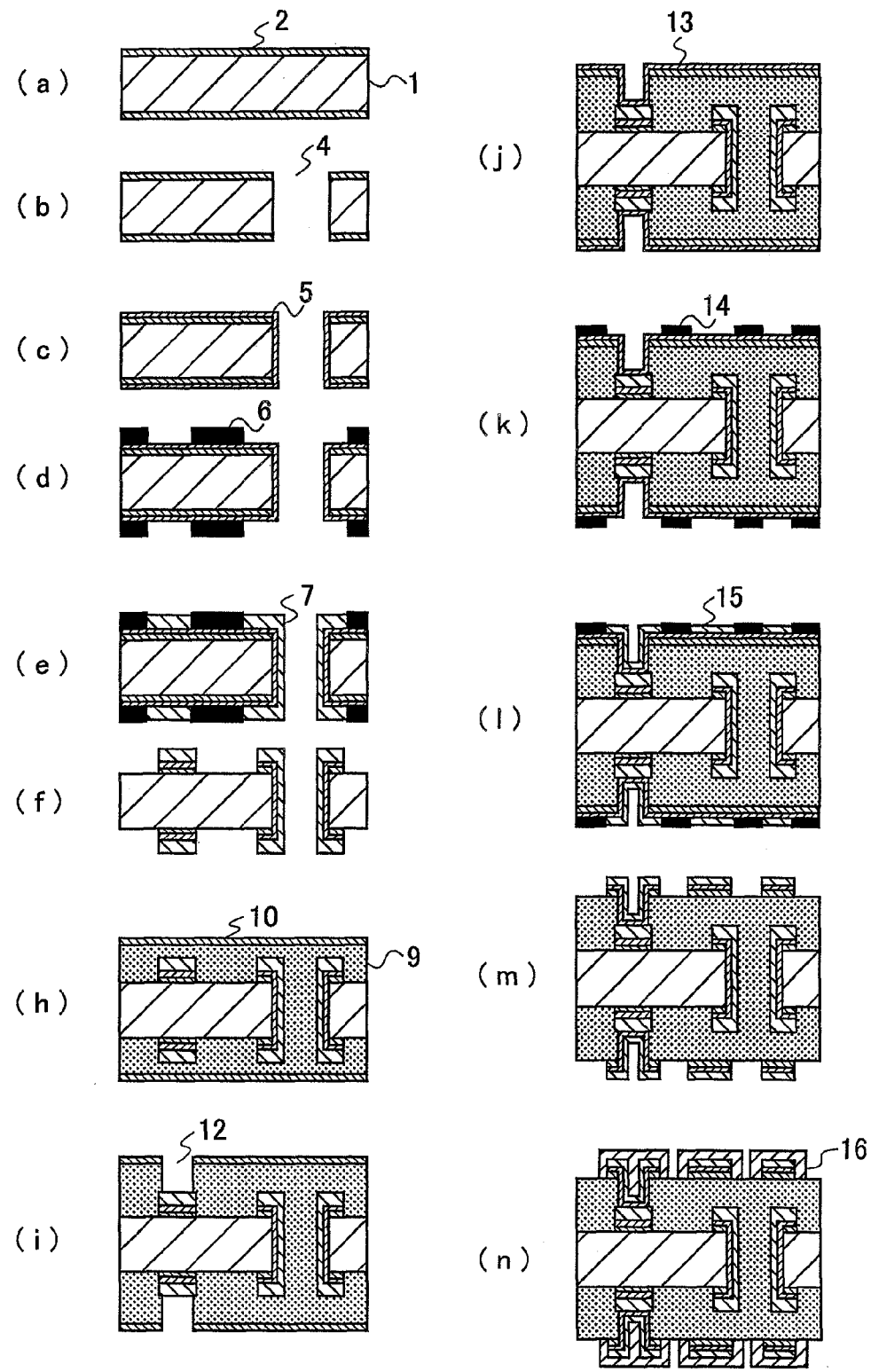
FIG. 1 shows a cross-sectional view showing one embodiment of printed wiring board production process according to the invention.
Figure 3:
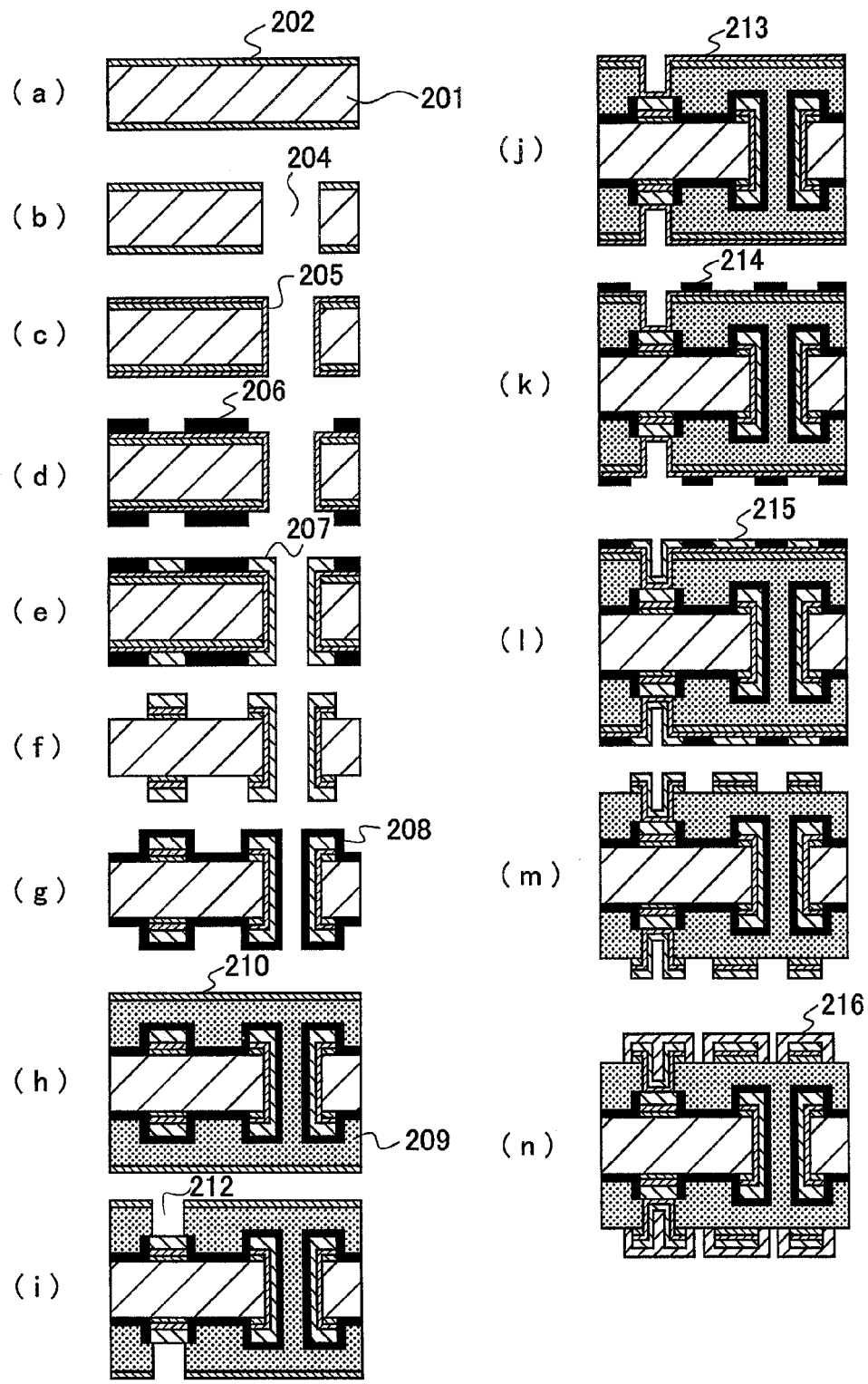
FIG. 3 shows a cross-sectional view showing another embodiment of printed wiring board production process according to the invention.

At first, a core substrate comprising two layers is produced. In the case of producing the core substrate, metal layers 2 and 202 are formed in both sides 1 and 201 of an insulating layer as shown in FIG. 1(a) and FIG. 3(a). For example, a method of using a laminate plate comprising metal foils on both sides of a prepreg is economical and therefore preferable.

As shown in FIG. 2(a), an adhesive layer 103 may be inserted between the insulating layer 101 and the metal layer 102 for improving the adhesion. The adhesive layer 103 is only an intermediate for improving the adhesion to the metal foils. The thickness of the adhesive layer is preferably 0.1 μm or thicker in terms of the adhesion. Also, the thickness of the adhesive layer is preferably 10 μm or thinner in consideration of the connection reliability. The thickness is further preferably 0.1 to 5 μm, even more preferably 0.5 to 2.0 μm. The thickness of the adhesive layer is desirable to be ⅛ or thinner than the thickness of the insulating layer in terms of the reliability and electric properties. A composite material of an inorganic substance and an organic substance is preferable for the insulating layer and a prepreg is preferable to use for lowering the cost.

The prepreg is produced by immersing or coating a substrate with a resin composition. As the substrate, various types of well known substrates used for laminate plates for electric insulating materials may be used. Examples of the materials for the substrate are inorganic fibers of such as E glass, D glass, S glass or Q glass; organic fibers of such as polyimides, polyesters, or tetrafluoroethylene; and their mixtures, however the materials are not limited to these examples.

These substrates may be in any form such as woven fabrics, nonwoven fabrics, roving, chopped strand mats, surfacing mats and the like. The materials and the forms of the substrate may be selected properly depending on the uses and functions of the aimed formed products. Further, if necessary, those made of one or more kinds of materials and having one or more forms may be used. The thickness of the substrate is not particularly limited, however those with a thickness of about 0.03 to 0.5 mm may be used in general. Those subjected to surface-treatment with a silane coupling agent or the like or to mechanical fibrillation are preferable in terms of the heat resistance, moisture resistance, and processability.

As a resin composition, conventionally known resin compositions to be used as insulating materials for a printed wiring board may be used. Generally, a thermosetting resin excellent in heat resistance and chemical resistance may be used as a base. Examples of the thermosetting resin are phenol resins, epoxy resins, cyanate resins, maleimide resins, isocyanate resins, benzocyclobutene resins, and vinyl resins, however the thermosetting resin is not limited to these examples. As the thermosetting resin, one kind of resins may be used alone or two kinds of resins may be mixed and used.

Among the thermosetting resins, the epoxy resins are widely used since they are excellent in heat resistance, chemical resistance, and electric properties and relatively economical. Examples of the epoxy resins are bisphenol type epoxy resins such as bisphenol A type epoxy resin, bisphenol F type epoxy resin, and bisphenol S type epoxy resin; novolak type epoxy resins such as phenol novolak type epoxy resin, cresol novolak type epoxy resin, and bisphenol A novolak type epoxy resin; alicyclic epoxy resins; aliphatic chain epoxy resins; diglycidyl ether compounds of bisphenol; diglycidyl ether compounds of naphthalene diol; diglycidyl ether compounds of phenol; diglycidyl ether compounds of alcohols; and their alkyl-substituted compounds, halogenated compounds, and hydrogenated compounds, however the epoxy resins are not limited to these examples. One kind of the epoxy resins may be used alone or two or more kinds of the epoxy resins may be mixed and used. As a curing agent to be used together with the epoxy resins, any agents may be used without particular limit if they can cure the epoxy resins. Examples of the curing agents are polyfunctional phenols, polyfunctional alcohols, amines, imidazole compounds, acid anhydrides, organic phosphorus compounds and their halides, however the curing agents are not limited to these examples. One kind of these epoxy resin curing agents may be used alone or two or more kinds may be mixed and used.

The cyanate ester resin is a thermosetting resin comprising triazine rings as repeating units and obtained by heating a cyanate compound. The resin is used in the case excellent high frequency properties are required since the resin is excellent in the dielectric properties. Examples of the cyanate compound are cyanate ester compounds such as 2,2-bis(4-cyanatophenyl)propane, bis(4-cyanatophenyl)ethane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, phenol novolak, and alkylphenol novolak, however the cyanate compound may not be limited particularly to these examples. Among them, 2,2-bis(4-cyanatophenyl)propane is preferable since it is excellent in the balance of the dielectric property of a cured product and curing property and is economically in terms of the cost. One kind of cyanate ester compounds may be used alone or two or more kinds may be mixed and used. The cyanate ester compound to be used here may be oligomerated partially into trimers and pentamers. A curing catalyst and a curing promoter may be added to the cyanate compound for curing. Examples of the curing catalyst may be metals such as manganese, iron, cobalt, nickel, copper, zinc and the like, however the catalyst may not be limited to these examples. Practical examples are organometal salts such as 2-ethylhexanates, naphthanates, and octylates; and organometal complexes such as acetylacetone complexes, however the catalyst may not be limited to these examples. They may be use alone or two or more kinds of them may be mixed and used. Phenols are used preferably as the curing promoter. Practically, examples are monofunctional phenols such as nonylphenyl and p-cumylphenyl; bifunctional phenols such as bisphenol A, bisphenol F, and bisphenol S; and polyfunctional phenol such as phenol novolak and cresol novolak, however it is not limited to these examples. They may be used alone or two or more kinds of them may be mixed and used.

In consideration of the dielectric properties, impact resistance, and film formability, the resin composition may be blended with a thermoplastic resin. Examples of the thermoplastic resin are fluoro resins, polyphenylene ethers, modified polyphenylene ethers, polyphenylene sulfides, polycarbonates, polyether imides, polyether ether ketones, polyallylates, polyamides, polyamide imides, polybutadienes, however the thermoplastic resin is not limited to these examples. The thermoplastic resins may be used alone or two or more types of them may be mixed and used.

The resin composition is preferable to have a specific dielectric constant 3.0 or lower or a dielectric dissipation factor 0.01 or lower at 1 GHz. Use of such a resin composition lowers the dielectric loss in wiring and makes it possible to form a circuit with a further lowered transmission loss. As a resin excellent in such dielectric properties, polyphenylene ethers and cyanate esters may be exemplified. In the case of using the polyphenylene esters for wiring board materials, it is required to add a thermosetting property to improve the heat resistance and the chemical resistance. For example, thermosetting resins such as epoxy resins, cyanate ester resins, triazine-bismaleimide resins may be blended with the polyphenylene ethers. Or, double bonds or polymerizable functional groups such as epoxy group may be introduced into the molecular chains of the polyphenylene ethers.

Among the thermoplastic resins, in the case of adding polyphenylene ethers and modified polyphenylene ethers, the dielectric properties of cured materials are improved and therefore they are useful. Examples of the polyphenylene ethers and modified polyphenylene ethers are poly(2,6-dimethyl-1,4-phenylene)ether, alloyed polymers of poly(2,6-dimethyl-1,4-phenylene)ether and polystyrene, alloyed polymers of poly(2,6-dimethyl-1,4-phenylene)ether and styrene-butadiene copolymers, alloyed polymers of poly(2,6-dimethyl-1,4-phenylene)ether and styrene-maleic anhydride copolymers, alloyed polymers of poly(2,6-dimethyl-1,4-phenylene)ether and polyamides, and alloyed polymers of poly(2,6-dimethyl-1,4-phenylene)ether and styrene-butadiene-acrylonitrile copolymers, however they are not limited to these examples. Further, to provide reactivity and polymerizability to the polyphenylene ethers, functional groups such as amino, epoxy group, carboxyl, styryl, and methacryl may be introduced into polymer terminals or functional groups such as amino, epoxy group, carboxyl, styryl, and methacryl may be introduced into the polymer side chains.

Among the thermoplastic resins, polyamide imide resins are excellent in heat resistance, and moisture resistance and therefore useful. Raw materials of the polyamide imide resins include acidic components and amine components. Examples of the acid components are trimellitic anhydride and trimellitic anhydride monochloride, however the components are not limited to these examples. Examples of the amine components are m-phenylenediamine, p-phenylenediamine, 4,4'-diaminodiphenyl ether, 4,4'-diaminodiphenylmethane, bis[4-(aminophenoxy)phenyl]sulfone, 2,2'-bis[4-(4-aminophenoxy)phenyl]propane, however the amine components are not limited to these examples. To improve the drying property, polyimide amide resins may be modified with siloxane. In such as case, siloxane diamine is used as the amino components. In consideration of the processability, it is preferable to use polyimide amide resins having a molecular weight of 50,000 or more. The polyimide amide resins may be described more in details later.

The resin composition may contain an inorganic filler. Examples of the inorganic filler are alumina, aluminum hydroxide, magnesium hydroxide, clay, talc, antimony trioxide, antimony pentoxide, zinc oxide, fused silica, glass powder, quartz powder, and shirasu balloon, however the inorganic filler may not be limited to the examples. These inorganic fillers may be used alone and two or more of them may be mixed and used.

The resin composition may contain an organic solvent. Examples of the organic solvent are aromatic hydrocarbons solvents such as benzene, toluene, xylene, and trimethylbenzene; ketone type solvents methyl ethyl ketone and methyl isobutyl ketone; ether type solvents such as tetrahydrofuran; alcohol type solvents such as isopropanol and butanol; ether alcohol type solvents such as 2-methoxyethanol, and 2-butoxyethanol; and amido type solvents such as N-methylpyrrolidone, N,N-dimethylformamide, and N,N-dimethylacetamide, however the organic solvent may not be limited to these examples and these solvents may be used properly in combination. The solvent amount in a varnish in the case of producing a prepreg is preferably in a range of 40 to 80% by weight and the viscosity of the varnish is preferably in a range of 20 to 100 cP.

The resin composition may contain a flame retardant. Examples to be used as the flame retardant are conventionally known flame retardants such as bromo compounds such as decabromodiphenyl ether, tetrabromobisphenol A, tetrabromophthalic anhydride, and tribromophenol; phosphorus compounds such as triphenyl phosphate, tricresyl phosphate, trixylyl phosphate, cresyldiphenyl phosphate; metal hydroxides such as magnesium hydroxide and aluminum hydroxide; red phosphorus and its modified products; antimony compounds such as antimony trioxide and antimony pentoxide; and triazine compounds such as melamine, cyanuric acid, melamine cyanurate, however the flame retardant is not limited to these examples.

Further, based on the necessity, various kinds of additives and fillers such as a curing agent, a curing promoting agent, thermoplastic particles, a coloring agent, a UV impermeable agent, an antioxidant, and a reducing agent may be added to the resin composition in the production.

In general, the substrate is impregnated in or coated with the resin composition in an adhesion amount of the composition to the substrate adjusted so as to be 20 to 90% by weight on the basis of resin content in the prepreg after drying and then the resin composition is dried generally at 100 to 200° C. for 1 to 30 minutes to obtain a prepreg in semi-cured state (in B stage state). One to twenty sheets of such prepreg are laminated; an adhesive is applied to both faces of the laminate; metal foils are attached to both faces and then the entire body of the resulting laminate is pressurized while being heated. Conventional laminate plate production technique may be employed for the forming conditions. For example, multi-step pressing, multi-press vacuum pressing, continuous forming, autoclave formation apparatus may be used for the formation. The formation may be carried out in conditions of 100 to 250° C. temperature, 2 to 100 kg/cm$^2$ pressure, and 0.1 to 5 hour heating. Also, using a vacuum lamination apparatus, the formation may be carried out in laminating conditions of 50 to 150° C. temperature and 0.1 to 5 MPa vacuum and atmospheric pressure. The thickness of the prepreg layer to be an insulating layer may differ depending on the uses, however it is generally preferably 0.1 to 5.0 mm.

It is preferable to use an insulating layer having a thermal expansion coefficient of 20 ppm/° C. or lower in the transverse direction (CTE X, CTE Y) in a range of 0 to 150° C. in terms of the improvement of reliability. Further, a resin having a tensile strength of 200 MPa or higher at 20° C. is preferable. GEA-E-679F and GEA-679-FG (trade names; manufactured by Hitachi Chemical Co., Ltd.), which are prepreg, may be used for the insulating layer.

Generally, a electrodeposition layer having many very small bumps (so-called Yake plating) is formed on the metal foils or the metal foils are subjected to roughening treatment by oxidation, reduction, or etching. Japanese Patent Application Laid-Open No. 8-21618 discloses substances for the above-mentioned electrodeposition and therefore, the invention include its specification as reference in this specification. However, the metal foils to be used in the invention are not subjected to the roughening treatment. Both faces of the metal foils to be used for the invention have 2.0 μm or less ten-point mean surface roughness (Rz) defined in JIS B 0601. If no roughening treatment is carried out, the unevenness of the metal foils is slight. Therefore, it is advantageous since the metal foils do not remain when the metal foils formed on the resin layer are removed by etching. Copper foils, nickel foils, and aluminum foils may be used as the metal foils and generally, copper foils are used. The production conditions of the copper foils are commonly sulfuric acid 50 to 100 g/L, copper 30 to 100 g/L, solution temperature 20 to 80° C., and current density 0.5 to 100 A/dm$^2$ in the case of a copper sulfate bath and potassium pyrophosphate 100 to 700 g/L, copper 10 to 50 g/L, solution temperature 30 to 60° C., pH 8 to 12, and current density 1 to 10 A/dm$^2$ in the case of a copper pyrophosphate bath. Various kinds of additives may be added in consideration of the physical properties and smoothness of copper.

Further, the foils to be used preferably are peelable type metal foils with a thickness of 0.3 μm or thinner and a surface roughness Rz of 2.0 μm or less. The peelable type metal foils are those having a carrier and the carrier is separable. For example, in the case of peelable type ultra thin copper foils, a metal oxide or an organic layer to be a peeling layer is formed on a carrier foil with a thickness of 10 to 50 μm and metal foils may be formed under the conditions of sulfuric acid 50 to 100 g/L, copper 30 to 100 g/L, solution temperature 20 to 80° C., and current density 0.5 to 100 A/dm$^2$ in the case of a copper sulfate bath. Also, the metal foils with a thickness of 0.3 to 3.0 μm may be formed under the conditions of potassium pyrophosphate 100 to 700 g/L, copper 10 to 50 g/L, solution temperature 30 to 60° C., pH 8 to 12, and current density 1 to 10 A/dm$^2$ in the case of a copper pyrophosphate bath. In the case of using such foils as electric power supply layers, the wiring formability is excellent as it will be described later. In place of the peelable type foils, etchable type copper foils having an aluminum carrier or a nickel carrier may be used.

The anti-rust treatment for the faces of the metal foils to be stuck to a resin may be carried out by using nickel, tin, zinc, chromium, molybdenum, cobalt or their alloys. Thin film formation on the metal foils is carried out by using the metal or alloys by sputtering, electroplating, or electroless plating. Among them, in terms of the cost, electroplating is preferable. Practically, plating is carried out by using a plating solution containing one or more salts of the above-exemplified metals to form the plating layer. A complexing agent such as a citric acid salt, tartaric acid salt, sulfamic acid may be added to make metal ion precipitation easy. The plating solution is generally used in an acidic region and plating is carried out at a room temperature to 80° C. Generally, the plating is carried out under the conditions properly selected form 0.1 to 10 A/dm$^2$ for the current density and 1 to 60 seconds, preferably 1 to 30 seconds for the current application period. The deposition amount of the anti-rust treatment metal differs depending on the metal type, however it is preferably 10 to 2,000 µg/dm$^2$ in total. If the thickness of the anti-rust treatment is too thick, it results in etching inhibition and electric property deterioration and if the thickness is too thin, it results in decrease of the peel strength to the resin.

In the case of containing a cyanate resin in the resin composition, nickel is preferable to be used as a main component for the anti-rust treatment for the metal foils. In this combination, the peel strength decrease is slight in a heat resistance deterioration test and a moisture resistance deterioration test and therefore, it is advantageous.

Further, if a chromate treatment layer is formed on the anti-rust treatment layer, decrease of the peel strength to the resin is suppressed and therefore, it is advantageous. Practically, the treatment is carried out by using an aqueous solution containing hexavalent chromium ion. The chromate treatment can be carried out by simple dipping treatment, however cathode treatment is carried out preferably. The treatment may be carried out preferably under the conditions of sodium dichromate 0.1 to 50 g/L, pH 1 to 13, bath temperature 0 to 60° C., current density 0.1 to 5 A/dm$^2$, and electrolytic period 0.1 to 100 seconds. Chromic acid or potassium dichromate may be used in place of sodium dichromate.

In the invention, it is preferable that a silane coupling agent is adsorbed in the outermost layers of the metal foils. Examples of the silane coupling agent are epoxy functional silanes such as 3-glycidoxypropyltrimethoxysilane and 2-(3,4-epoxycyclohexylethyltrimethoxysilane; amino functional silanes such as 3-aminopropyltrimethoxysilane, N-2-(aminoethyl)-3-aminopropyltrimethoxysilane, and N-2-(aminoethyl)-3-aminopropylmethyldimethoxysilane; olefin functional silanes such as vinyltrimethoxysilane, vinylphenyltrimethoxysilane, and vinyltris(2-methoxyethoxy)silane; acrylic functional silanes such as 3-acryloxypropyltrimethoxysilane; methacrylic functional silanes such as 3-methacryloxypropyltrimethoxysilane; and mercapto functional silanes such as 3-mercaptopropyltrimethoxysilane. They may be used alone or a plurality of the silanes may be mixed and used. These coupling agents may be dissolved in a solvent in a concentration of 0.1 to 15 g/L and applied to the metal foils at a room temperature to 50° C. or electrodeposited for the adsorption. These silane coupling agents form a coating by forming condensation bonding with the hydroxyl groups of the anti-rust metal on the metal foil surface. Stable bonds can be formed by heating or UR radiation after the silane coupling agent treatment. In the case of heating, the silane coupling treatment is dried at 100 to 200° C. for 2 to 60 second. In the case of UV radiation, the radiation is carried out with 200 to 400 nm wavelength and 200 to 2,500 mJ/cm$^2$ intensity.

The combination of the silane coupling agent with the insulating layer or an adhesive layer is preferably selected so as to cause chemical reaction of the functional groups of the insulating layer or the adhesive layer with the functional groups of the silane coupling agent. For example, in the case epoxy groups are contained in the insulating layer or the adhesive layer, if an amino functional silane is selected as the silane coupling agent, the effect is more efficiently exhibited. It is attributed to that firm chemical bonds are formed between the epoxy groups and amino groups and the bonds are extremely stable to the heat and water. As combinations to form such chemical bonds, epoxy group-amino group; epoxy group-epoxy group; epoxy group-mercapto group; epoxy group-hydroxyl group; epoxy group-carboxyl group; epoxy group-cyanato group; amino group-hydroxyl group; amino group-carboxyl group; and amino group-cyanato group can be exemplified.

In the case the insulating layer or the adhesive layer contains an epoxy resin which is liquid at a normal temperature, the viscosity is considerably decreased at the time of melting. Therefore, the wettability in the adhesion interface is improved and the chemical reaction of the epoxy resin and the coupling agent is easily caused. As a result, a high peel strength can be obtained. Practically, bisphenol A type epoxy resin, bisphenol F type epoxy resin, and phenol novolak type epoxy resin with about 200 epoxy equivalent are preferable.

In the case the insulating layer or the adhesive layer contains a hardening agent, as the hardening agent, a heat curable latent curing agent is preferably used. That is, in the case chemical reaction is caused between the functional groups of the thermosetting resin and the functional groups of the silane coupling agent, it is preferable to select the curing agent so as to make the reaction temperature of the functional groups of the thermosetting resin and the functional groups of the silane coupling agent lower than the temperature at which the curing reaction of the thermosetting resin. Accordingly, the reaction of the functional groups of the thermosetting resin and the functional groups of the silane coupling agent is carried out in higher priority and selectively. Therefore, the adhesion of the metal foils and the resin composition is increased. As the thermosetting type latent curing agent for the resin composition containing the epoxy resin, solid dispersion-heat dissolution type curing agents of such as dicyandiamine, dihydrazide compounds, imidazole compounds, and amine-epoxy adducts and reactive group block type curing agents of such as urea compounds, onium compounds, boron trichloride-amine salts, block carboxylic acid compounds can be exemplified.

If a polyamide imide type resin is contained in the insulating layer or adhesive layer, especially high adhesion can be obtained. Since the polyamide imide resin type adhesive shows high adhesion to a copper foil which is not subjected to the anti-rust treatment or coupling agent treatment, these treatments may be eliminated.

As a production method of the polyamide imide, an isocyanate method based on the reaction of trimellitic anhydride and an aromatic diisocyanate is available. Application examples of the method are a method (U.S. Pat. No. 2,897,186) involving reaction of an aromatic tricarboxylic acid anhydride and a diamine having ether bond in excess diamine condition and then reaction with diisocyanate and a method (Japanese Patent Application Laid-Open No. 04-182466) involving reaction of an aromatic diamine and trimellitic anhydride.

It is also possible to improve the properties such as the modulus of elasticity, flexibility, and drying efficiency by introducing siloxane structure into the polyamide imide. The polyamide imide can be produced according to the isocyanate method and for example, a method (Japanese Patent Application Laid-Open No. 05-009254) involving condensation polymerization of an aromatic tricarboxylic acid anhydride, an aromatic diisocyanate, and siloxanediamine; a method (Japanese Patent Application Laid-Open No. 6-116517) involving condensation polymerization of an aromatic dicarboxylic acid or an aromatic tricarboxylic acid with siloxanediamine; and a method (Japanese Patent Application Laid-Open No. 11-130831) involving reaction of an aromatic diisocyanate with a mixture containing a diimide dicarboxylic acid obtained by reaction of trimellitic acid and a mixture containing a diamine having 3 or more aromatic rings and siloxanediamine can be exemplified. The polyamide imide type adhesive layer is used while being mixed with a thermosetting epoxy resin-containing resin composition based on necessity. The disclosure of the U.S. Pat. No. 2,897,186, Japanese Patent Application Laid-Open Nos. 04-182466, 05-009254, 06-116517, and 11-130831 is expressly incorporated herein by reference in its entirety.

The resin composition as described above and metal foils which are not subjected to the surface roughening treatment are laminated and united by a conventionally known method to obtain a laminate plate shown in FIG. 1(a) and FIG. 3(a). The adhesive and the metal foils which are not subjected to the surface roughening treatment are printed by a conventional method and after that the foils are laminated on the insulating layers to obtain the laminate plate shown in FIG. 2(a).

Next, penetrating through holes 4, 104, and 204 for interlayer connection are formed in the above-mentioned laminate body (FIG. 1(b), FIG. 2(b), and FIG. 3(b)). If the through hole diameter is 100 μm or wider, drilling work is suitable. If the through hole diameter is 100 μm or narrower, gas laser of $CO_2$, CO, and excimer laser, and solid laser such as YAG laser are suitable to be employed. If the through hole diameter is around 100 μm, either method may be used.

Next, a catalyst core is supplied to the metal foils and the IVH insides. To supply the catalyst core, a noble metal ion or palladium colloid is used. Practically, Activator Neoganth (trade name, manufactured by Atotech Japan K.K.), a palladium ion catalyst, and HS 201B (trade name, manufactured by Hitachi Chemical Co., Ltd.), a palladium colloid catalyst can be used. In the case of supplying the palladium catalyst, conditioning treatment with such as CLC-201 (trade name, manufactured by Hitachi Chemical Co., Ltd.) is previously carried out.

Next, as shown in FIG. 1(c), FIG. 2(c), and FIG. 3(c), thin electroless plating layers 5, 105, and 205 are formed on the metal foils and IVH insides to which the catalyst core is supplied. For the electroless plating, commercialized electroless copper plating solutions such as CUST 2000 (trade name, manufactured by Hitachi Chemical Co., Ltd.) and CUST 201 (trade name, manufactured by Hitachi Chemical Co., Ltd.) can be employed, however the plating is not limited to the examples. These electroless copper plating solutions contain mainly copper sulfate, formalin, a complexing agent, and sodium hydroxide. The thickness of the plating is sufficient if the next electroplating can be carried out thereon and it is about 0.1 to 1 μm.

Next, as shown in FIG. 1(d), FIG. 2(d), and FIG. 3(d), plating resist 6, 106, and 206 is formed on the electroless plating layers. The thickness of the plating resist is preferably as same as or thicker than the thickness of a conductor for planting thereafter. Examples of the resin to be used for the plating resist are liquid phase resist such as PMER P-LA900PM (trade name; manufactured by Tokyo Ohka Kogyo Co., Ltd.), and dry films such as HW-425 (trade name, manufactured by Hitachi Chemical Co., Ltd.) and RY-3025 (trade name, manufactured by Hitachi Chemical Co., Ltd.). The plating resist should not be formed on the portions to be via holes and a conductor circuit.

Next, as shown in FIG. 1(e), FIG. 2(e), and FIG. 3(e), circuit patterns 7, 107, and 207 are formed by electroplating. A copper sulfate electroplating to be used commonly for a printed wiring board may be used. The thickness of the plating is sufficient if it is used as a circuit conductor and preferably in a range of 1 to 100 μm, more preferably in a range of 5 to 50 μm.

Next, as shown in FIG. 1(f), FIG. 2(f), and FIG. 3(f), resist is separated and the metal other than the pattern parts is removed. As a resist separation solution, alkaline separation solutions, sulfuric acid, and commercialized resist separation solutions may be employed. As the metal other than the pattern parts, for example copper is removed by etching. In this case etching is generally carried out by high pressure spraying or the like. However, the solution exchange is deteriorated inevitably in the portions where the wiring is made fine. Accordingly, the reaction of the copper and the etching solution is desirably carried out based on the reaction speed but not on the diffusion speed. If the reaction of copper and the etching solution is carried out based on the reaction speed, even if the diffusion is more increased, the etching speed is not changed. That is, no etching speed difference is caused between the portions where the solution exchange is well promoted and the portions where the solution exchange is poorly promoted. Practically, an etching solution containing hydrogen peroxide and a halogen element-free acid as main components is preferably used. If hydrogen peroxide is used as an oxidizing agent, strict etching speed control is made possible by controlling the hydrogen peroxide concentration. Additionally, if a halogen element is added to the etching solution, the dissolution reaction tends to be promoted depending on the diffusion speed. As the halogen-free acid, nitric acid, sulfuric acid, and organic acids are usable and sulfuric acid is economical and therefore preferable. In the case the etching solution contains sulfuric acid and hydrogen peroxide as main components, their concentrations are preferable to be 5 to 300 g/L and 5 to 200 g/L, respectively, in terms of the etching speed and the stability of the solution.

According to the method described above, a core substrate composed of two layers is completed. Further, in the case of producing a four-layer plate, the inner conductor circuits on the surface of the core substrate are surface-roughened to improve the close adhesion to the interlayer resin insulating layers to be formed on the copper patterns. Practically, a method of forming needle-like electroless plating layers on the core substrate, a method of oxidizing (blackening)-reducing the inner copper patterns, and a method of etching the inner copper patterns are available. However, since these methods require the inner conductor circuits to be surface-roughened, a method which does not include a surface-roughening step as described below is more preferable. That is, as shown in FIG. 2(g) and FIG. 3(g), the entire conductor circuits are preferable to be covered with polyamide imide as an adhesion promoting agent 108, 208. Accordingly, even if copper foils which are not treated are provided with high adhesion property. To improve the adhesion, that is, as the adhesion promoting agent, the thickness of the polyamide imide layer is preferably 0.1 to 10 μm and more preferably 0.1 to 5 μm. If the thickness of the polyamide imide layer is thinner than 0.1 μm, the adhesion property is insufficient and if it is thicker than 10 μm, the respective properties such as elongation, dielectric constant, and dielectric dissipation factor are affected inversely in some cases.

The conductor circuit surface may be subjected to anti-rust treatment with nickel, tin, zinc or palladium or surface-roughening treatment. Accordingly, not only high adhesion is provided but also the anti-rust treatment degree or the surface-treatment degree can be decreased in some cases. That is, the invention may be combined with a conventionally known method.

By the above-mentioned method, sufficiently high adhesion strength can be obtained. To obtain further high adhesion strength, a polyimide amide comprising saturated hydrocarbon repeating unit is preferable. It is also more preferable to contain an alicyclic hydrocarbon group in the repeating unit. Existence of the alicyclic hydrocarbon group provides moisture absorbing property and heat resistance to the polyamide imide and also a high Tg. Use of such a polyamide imide improves the reliability.

The saturated hydrocarbon component comprising the alicyclic hydrocarbon group may be derived from a diamine compound comprising a saturated hydrocarbon having an alicyclic hydrocarbon group as a raw material.

Such a diamine is defined by the following general formula (1a) or (1b).

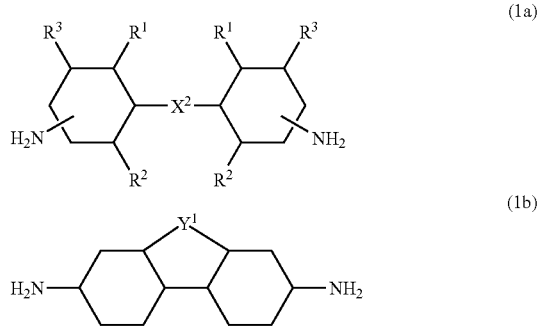

In the formula, $X^1$ represents an aliphatic hydrocarbon group having 1 to 3 carbon atoms, a halo aliphatic hydrocarbon group having 1 to 3 carbon atoms, sulfonyl, an ether group, carbonyl, a single bond, or a divalent group defined by the following general formula (2a) or (2b); $Y^1$ represents an aliphatic hydrocarbon group having 1 to 3 carbon atoms, a halo aliphatic hydrocarbon group having 1 to 3 carbon atoms, sulfonyl, an ether group, or carbonyl; $R^1$, $R^2$, and $R^3$ may be same or different from one another and independently represent a hydrogen atom, hydroxyl, methoxy group, methyl, or a halo methyl:

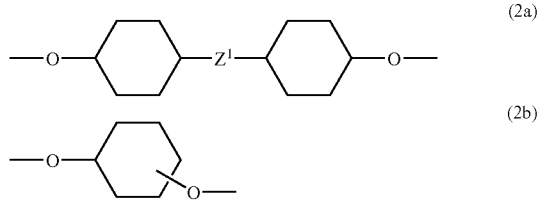

wherein $Z^1$ represents an aliphatic hydrocarbon group having 1 to 3 carbon atoms, a halo aliphatic hydrocarbon group having 1 to 3 carbon atoms, sulfonyl, an ether group, carbonyl, or a single bond.

Examples of the diamine compound comprising a saturated hydrocarbon having an alicyclic hydrocarbon group are 2,2-bis[4-(4-aminocyclohexyloxy)cyclohexyl]propane, bis[4-(3-aminocyclohexyloxy)cyclohexyl]sulfone, bis[4-(4-aminocyclohexyloxy)cyclohexyl]sulfone, 2,2-bis[4-(4-aminocyclohexyloxy)cyclohexyl]hexafluoropropane, bis[4-(4-aminocyclohexyloxy)cyclohexyl]methane, 4,4'-bis(4-aminocyclohexyloxy)dicyclohexyl, bis[4-(4-aminocyclohexyloxy)cyclohexyl]ether, bis[4-(4-aminocyclohexyloxy)cyclohexyl]ketone, 1,3-bis(4-aminocyclohexyloxy)benzene, 1,4-bis(4-aminocyclohexyloxy)benzene, 2,2'-dimethylbicyclohexyl-4,4'-diamine, 2,2'-bis(trifluoromethyl)dicyclohexyl-4,4'-diamine, 2,6,2',6'-tetramethyl-4,4'-diamine, 5,5'-dimethyl-2,2'-sulfonyl-dicyclohexyl-4,4'-diamine, 3,3'-dihydroxydicyclohexyl-4,4'-diamine, (4,4'-diamino)dicyclohexyl ether, (4,4'-diamino)dicyclohexylsulfone, (4,4'-diaminocyclohexyl)ketone, (3,3'-diamino)benzophenone, (4,4'-diamino)dicyclohexylmethane, (4,4'-diamino)dicyclohexyl ether, (3,3'-diamino)dicyclohexyl ether, (4,4'-diamino) dicyclohexylmethane, (3,3'-diamino)dicyclohexyl ether, and 2,2-bis(4-aminocyclohexyl)propane, however the diamine compound is not limited to these examples. Two or more kinds of these diamine compounds may be mixed and used and further, other diamine compounds may be used in combination.

Such a diamine compound comprising a saturated hydrocarbon having an alicyclic hydrocarbon group is easily produced by hydrogen reducing an aromatic diamine compound.

Examples of such an aromatic diamine compound are 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)diphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)diphenyl-4,4'-diamine, 2,6,2',6'-tetramethyl-4,4'-diamine, 5,5'-dimethyl-2,2'-sulfonyl-biphenyl-4,4'-diamine, 3,3'-dihydroxydiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether, and (3,3'-diamino)diphenyl ether, however, the aromatic diamine compound is not limited to these examples.

Hydrogen reduction of the aromatic diamine compound is carried out by a general reduction method of an aromatic ring. Practically, examples of the method are methods using catalyst systems such as Raney Nikkel and platinum oxide in the presence of hydrogen (D. Varech et al, Tetrahedron Letter 26, 61(1985); R. H. Baker et al, J. Am. Chem. Soc., 69, 1250 (1947)); rhodium-aluminum oxide (J. C. Sircar et al, J. Org. Chem., 30, 3206(1965); A. I. Meyers et al, Organic Synthesis Collective Volume VI, 371(1988); A. W. Burgstahler, Organic Synthesis Collective Volume V, 591(1973); A. J. Briggs, synthesis, 1988, 66); rhodium oxide-platinum oxide (S. Nishimura, Bull, Chem. Soc. Jpn., 34, 32(1961); E. J. Corey et al, J. Am. Chem. Soc. 101, 1608(1979)); charcoal carrying rhodium (K. Chebaane et al, Bull. Soc. Chim. Fr., 1975, 244) and sodium boron hydride-rhodium chloride system (P. G. Gassman et al, Organic Synthesis Collective Volume VI, 581 (1988); P. G. Gassman et al, Organic Synthesis Collective Volume VI, 601 (1988)), however the method is not limited to these exemplified methods.

In addition to the above-mentioned diamine compound as the aliphatic diamine compound, a compound defined by the following general formula (4) may be used in the polyamide imide and its production method of the invention.

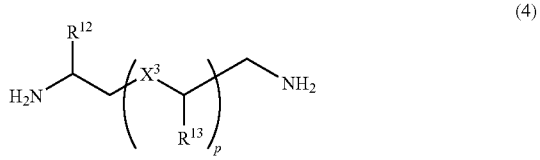

In the formula, $X^3$ represents methylene group, sulfonyl, an ether group, carbonyl, or a single bond; $R^{12}$ and $R^{13}$ independently represent a hydrogen atom, an alkyl, phenyl, or a substituted phenyl; and p represents an integer of 1 to 50.

Practical examples for $R^{12}$ and $R^{13}$ are preferably a hydrogen atom, an alkyl with 1 to 3 carbon atoms, phenyl, and a substituted phenyl. As the substituent group to be bonded to the phenyl, an alkyl with 1 to 3 carbon atoms and halogen atoms can be exemplified.

With respect to the aliphatic diamine defined by the above-mentioned general formula (4), $X^3$ in the formula (4) is preferably an ether group in terms of the low modulus of elasticity and high Tg. Examples of such an aliphatic diamine are Jeffamine D-400 and Jeffamine D-200 manufactured by Huntsman LLC, however it is not limited to these examples.

It is supposed that the polyamide imide having the above-mentioned aliphatic structure is provided with extremely high water absorbing ability and water-shedding property as compared with a conventional polyamide imide. Accordingly, in the case the polyamide imide comprising the saturated hydrocarbon containing the alicyclic hydrocarbon group is used for a thermosetting resin composition, which will be described later, as the layer formation material of a laminate, the decrease of the adhesion strength at the time of absorbing moisture is suppressed as compared with that in the case of using a polyamide imide composition containing aromatic composition before the hydrogen reduction.

In the polyamide imide and the production method of the invention, in addition to the above-exemplified diamine compounds as the diamine compound, an aromatic diamine may further be added.

Examples of such an aromatic diamine compound are those defined by the following general formula (5a) or the following general formula (5b).

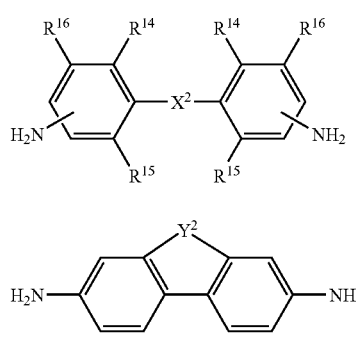

(5a)

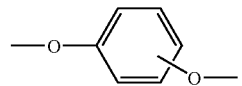

(5b)

In the above-mentioned general formula (5a), $X^2$ represents an aliphatic hydrocarbon group having 1 to 3 carbon atoms, a halo aliphatic hydrocarbon group having 1 to 3 carbon atoms, sulfonyl, an ether group, carbonyl, a single bond, or a divalent group defined by the following general formula (6a) or (6b); $R^{14}$, $R^{15}$, and $R^{16}$ may be same or different from one another and independently represent a hydrogen atom, hydroxyl, methoxy group, methyl, or a halo methyl: and in the above-mentioned general formula (5b), $Y^2$ represents an aliphatic hydrocarbon group having 1 to 3 carbon atoms, a halo aliphatic hydrocarbon group having 1 to 3 carbon atoms, sulfonyl, an ether group, or carbonyl;

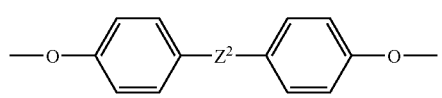

(6a)

(6b)

wherein $Z^2$ represents an aliphatic hydrocarbon group having 1 to 3 carbon atoms, a halo aliphatic hydrocarbon group having 1 to 3 carbon atoms, sulfonyl, an ether group, carbonyl, or a single bond.

As the above-mentioned aromatic diamine, compounds comprising aromatic ring system to which two amino groups are directly bonded and diamines to which two or more aromatic rings are directly or through one functional group bonded can be exemplified without any particular limit. Practical examples of the diamine are 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)diphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonyl-biphenyl-4,4'-diamine, 3,3'-dihydroxydiphenyl-4,4'-diamine, (4,4'-diamino)diphenyl ether, (4,4'-diamino)diphenylsulfone, (4,4'-diaminophenyl)benzophenone, (3,3'-diamino)benzophenone, (4,4'-diamino)diphenylmethane, (4,4'-diamino)diphenyl ether, and (3,3'-diamino)diphenyl ether, however, the aromatic diamine compound is not limited to these examples. Two of more kinds of these aromatic diamine compounds may be mixed and used.

Use of the above-mentioned aromatic diamine compounds further increases Tg and improves the heat resistance.

In the polyamide imide and its production method of the invention, in addition to the above-exemplified diamine compounds as the diamine compound, a siloxane diamine defined by the general formula (3) may be further contained.

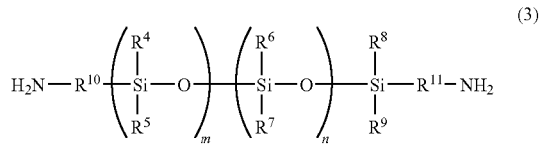

(3)

In the general formula (3), $R^4$ to $R^9$ independently represent preferably an alkyl having 1 to 3 carbon atoms, phenyl, or a substituted phenyl. As the substituent group of the substituted phenyl, an alkyl having 1 to 3 carbon atoms or a halogen atom is preferable. $R^{10}$ to $R^{11}$ independently represent preferably an alkylene having 1 to 6 carbon atoms or an arylene group. As the arylene group, phenylene, substituted phenylene, naphthalene, or substituted naphthalene is preferable. As the substituent group of the substituted arylene, an alkyl having 1 to 3 carbon atoms or a halogen atom is preferable. Additionally, $R^4$ to $R^{11}$ which respectively exist in plural number may be same or different from one another. As such a siloxanediamine, dimethylsiloxane-terminated diamines are particularly preferable. These siloxanediamines may be used alone or in combinations. Examples of the siloxanediamine defined by the above-mentioned general formula (3) are Silicone Oil X-22-161AS (amine equivalent 450), X-22-161A (amine equivalent 840), X-22-161B (amine equivalent 1,500), X-22-9409 (amine equivalent 700), X-22-1660B-3 (amine equivalent 2,200) (all exemplified above are manufactured by Shin-Etsu Chemical Co., Ltd.), BY16-853 (amine equivalent 650), BY16-853BA (amine equivalent 200), (all exemplified above are manufactured by Dow Corning Toray Co., Ltd.) and they are industrially made available, however the siloxanediamine is not limited to these examples.

In a production method of the polyamide imide, addition of the above-mentioned siloxanediamine makes the polyamide imide to be obtained have the siloxane structure in the main chain. Therefore, the flexibility of the polyamide imide to be obtained can be improved and occurrence of blister or the like under high temperature condition can remarkably be suppressed.

In the production method of polyamide imide, the amino groups of the above-mentioned diamine compounds are reacted with carboxyl groups of trimellitic anhydride or carboxyl anhydride. Among them, reaction with carboxyl anhydride is preferable. Such a reaction is carried out at 70 to 100° C. in a non-proton type polar solvent.

Examples of the non-proton type polar solvent are N-methyl-2-pyrrolidone (NMP), γ-butyrolactone, dimethylformamide, dimethylacetamide, dimethyl sulfoxide, sulfolane, and dimethylcyclohexanone, however non-proton type polar solvent is not limited to these examples. One or more of these solvents may be used, however NMP is preferable to be used.

Such a non-proton type polar solvent is added in an amount so as to control the solid content preferably 10 to 70% by weight, more preferably 20 to 60% by weight, in the entire weight of the solution. If the solid content concentration in the solution is less than 10% by weight, since the use amount of the solvent is so much, it tends to be industrially disadvantageous. If it exceeds 70% by weight, the solubility of trimellitic anhydride is decreased and therefore it becomes difficult to carry out reaction sufficiently in some cases.

On completion of the above-mentioned reaction, an aromatic hydrocarbon azeotropic with water is added and reaction is further promoted at 150 to 200° C. for dehydration ring-closing reaction. Accordingly, an imido group-containing dicarboxylic acid can be obtained. Examples of the aromatic hydrocarbon azeotropic with water are toluene, benzene, xylene and ethylbenzene, however the aromatic hydrocarbon azeotropic with water is not limited to these examples. Among them, toluene is preferably used. Such an aromatic hydrocarbon is preferably added in an amount of 10 to 50% by weight to the weight of the non-proton polar solvent. If the addition amount of the aromatic hydrocarbon is less than 10% by weight to the weight of the non-proton polar solvent, the water removal effect tends to be insufficient and the production amount of the imido group-containing dicarboxylic acid also tends to be decreased. If it exceeds 50% by weight, the reaction temperature is decreased and the production amount of the imido group-containing dicarboxylic acid also tends to be decreased.

Further, in the dehydration ring-closing reaction, the aromatic hydrocarbon is sometimes distilled simultaneously with water, so that the aromatic hydrocarbon amount sometimes becomes less than the above-mentioned preferable range. Therefore, it is preferable to keep the aromatic hydrocarbon amount constant by separating the aromatic hydrocarbon distilled to the plug-equipped water quantitative receiver from water and then turning the aromatic hydrocarbon back. On completion of the dehydration ring-closing reaction, it is preferable to keep the temperature at 150 to 200° C. to remove the aromatic hydrocarbon azeotropic with water.

The imido group-containing dicarboxylic acid to be obtained by the above-mentioned reaction is preferably the compound defined by the following general formula (7a). In the formula, G represents a residual group derived from the diamine defined by the general formulas (1a), (1b), (3), (4), (5a) or (5b) from which the amino group is removed. $R^1$ to $R^{16}$ and p, m, and n are same as defined above.

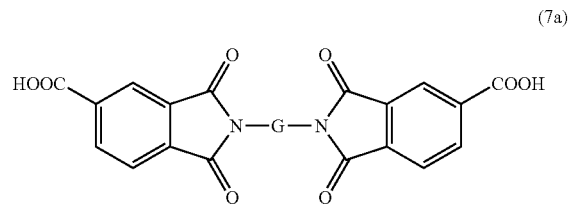

(7a)

The polyamide imide used in the invention can be produced by inducing the above-mentioned imido group-containing dicarboxylic acid to acid halide and polymerizing the acid halide with the above-mentioned diamine compound.

In such a reaction, the imido group-containing dicarboxylic acid is easily led to the acid halide by thionyl chloride, phosphorus trichloride, phosphorus pentachloride, or dichloromethyl methyl ether. The imido group-containing dicarboxylic acid halide is easily polymerized with the above-mentioned diamine compound.

The polyamide imide used in the invention is produced by polymerizing the above-mentioned imido group-containing dicarboxylic acid with the above-mentioned diamine compound in the presence of a condensation agent.

In such a reaction, as the condensation agent, common condensation agents for forming amido bond can be used. For the condensation, particularly dicyclohexylcarbodiimide, diisopropylcarbodiimide, or N-ethyl-N'-3-dimethylaminopropylcarbodiimide is preferably used alone or in combination with N-hydroxysuccinimide or 1-hydroxybenzotriazole.

The polyamide imide used in the invention is produced also by converting the imido group-containing dicarboxylic acid into the acid halide and causing reaction of the acid halide with diisocyanate.

In such a reaction, diamine compound:trimellitic anhydride diisocyanate is preferably in a range of 1:(2 to 2.2):(1 to 1.5) by mole and more preferably in a range of 1:(2 to 2.2):(1 to 1.3) by mole. A polyamide imide having a high molecular weight and advantageous in the film formability can be obtained by controlling the mole ratio in the above-mentioned range.

As the diisocyanate to be employed for the polyamide imide production method of the invention, a compound defined by the general formula (8) can be used.

OCN-D-NCO    (8)

In the formula, D represents a divalent organic group having at least one aromatic ring or a divalent aliphatic hydrocarbon group. Practically, at least one group selected from —$C_6H_4$—$CH_2$—$C_6H_4$, tolylene, naphthylene, hexamethylene, 2,2,4-trimethylhexamethylene, and isophorone group is preferable.

As the diisocyanate defined by the above-mentioned general formula (8), an aliphatic diisocyanate or an aromatic diisocyanate may be used. Between them, the aromatic diisocyanate is preferably used and combination use of both is more preferable.

Examples of the aromatic diisocyanate are 4,4'-diphenylmethane diisocyanate (MDI), 2,4-tolylene diisocyanate, 2,6- tolylene diisocyanate, naphthalene-1,5-diisocyanate, and 2,4-tolylene dimer, however the aromatic diisocyanate is not limited to these examples. Among them, MDI is preferably used. Use of MDI improves the flexibility of the polyamide imide to be obtained and decreases the crystallinity and accordingly improves the film formability of the polyamide imide.

Examples of the aliphatic diisocyanate are hexamethylene diisocyanate, 2,2,4-trimethylhexamethylene diisocyanate, and isophorone diisocyanate, however the aliphatic diisocyanate is not limited to these examples.

In the case the aromatic diisocyanate and the aliphatic diisocyanate are used in combination, the aliphatic diisocyanate is preferably added in an amount of 5 to 10% by mole to the aromatic diisocyanate. Such combination use further improves the heat resistance of the polyimide amide to be obtained.

The reaction of the imido group-containing dicarboxylic acid and diisocyanate is carried out by adding the diisocyanate to a solution containing the imido group-containing dicarboxylic acid obtained by the above-mentioned reaction and keeping the reaction temperature at 130 to 200° C.

In the case of using a basic catalyst, the reaction of the imido group-containing dicarboxylic acid and the diisocyanate is carried out preferably at 70 to 180° C. and more preferably at 120 to 150° C. In the case of the reaction in the presence of such a basic catalyst, the reaction can be carried out at a lower temperature than that of the reaction to be carried out in the absence of the basic catalyst. Therefore, the side reaction such as reaction of the diisocyanate molecules themselves can be suppressed and a polyamide imide with a further higher molecular weight can be obtained.

Examples of such a basic catalyst are trialkylamines such as trimethylamine, triethylamine, tripropylamine, tri(2-ethylhexyl)amine, and trioctylamine. Among them, triethylamine has a preferable basicity for reaction promotion and is easy to be removed after the reaction and therefore is preferable.

The polyamide imide to be obtained by the above-mentioned reaction comprises a repeating unit defined by the following general formula (9). In the formula, G represents a residual group derived from the diamine defined by the general formulas (1a), (1b), (3), (4), (5a) or (5b) from which the amino group is removed. $R^1$ to $R^{16}$ and p, m, and n are same as defined above.

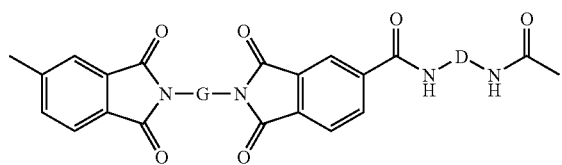

(9)

The polyamide imide obtained in such a manner as described above has a weight average molecular weight preferably 20,000 to 300,000, more preferably 30,000 to 200,000, and even more preferably 40,000 to 150,000. In this case, the weight average molecular weight is obtained by carrying out measurement by gel permeation chromatography and conversion based on the calibration curve produced by using standardized polystyrenes.

A thermosetting adhesive can be obtained by adding a functional group-containing amido-reactive compound to be reacted with the amido of the polyamide imide to the polyamide imide obtained in the above-mentioned manner.

The amido-reactive compound is a compound having a functional group to be reacted with the amido group of the polyamide imide by heating. As the amido-reactive compound, a polyfunctional epoxy compound and an oxetane compound can be exemplified, and the polyfunctional epoxy compound is preferably used.

Examples of the polyfunctional epoxy compound are bisphenol A type epoxy resin, tetrabromobisphenol A type epoxy resin, bisphenol F type epoxy resin, bisphenol S type epoxy resin, and biphenyl type epoxy resin, however the epoxy compound is not limited to these examples. One or more types of these exemplified compounds can be used.

The addition amount of the amido-reactive compound is preferably 10 to 40 part by weight, more preferably 15 to 25 part by weight to polyamide imide 100 part by weight. If the addition amount of the amido-reactive compound is less than 10 part by weight, the thermosetting property of the adhesive to be obtained tends to be deteriorated. If it exceeds 40 part by weight, the cross-linked structure of the adhesive layer after curing the adhesive becomes dense and the brittle property of the resin tends to be decreased.

The above-mentioned adhesive is preferable to further contain a curing promoting agent. The curing promoting agent is a component to promote curing of the mixture of the polyamide imide and the amido-reactive compound and is preferably a compound promoting the curing of particularly the amido-reactive compound. Example of the curing promoting agent are amines and imidazoles, however the agent is not limited to them. One or more of these compounds can be used.

Examples of the amines are dicyandiamide, diaminodiphenylethane, and guanylurea, however the amines are not limited to these exemplified compounds. Examples of the imidazoles are alkyl-substituted imidazoles such as 2-ethyl-4-methylimidazole and benzoimidazole, however the imidazoles are not limited to these exemplified compounds.

The addition amount of the such a curing promoting agent may be determined depending on the type of the amido-reactive compound. For example, in the case a polyfunctional epoxy compound is used as the amido-reactive compound and amines are used as the curing promoting agent, amines are preferably added in an amount proper to adjust the epoxy equivalent of the polyfunctional epoxy compound and the equivalent of the active hydrogen of the amino groups of the amines to be approximately same. In the case imidazoles are used as the curing promoting agent, the imidazoles are preferably added in an amount of 0.1 to 2.0 part by weight to the polyfunctional epoxy compound 100 part by weight. If the addition amount of the curing promoting agent is insufficient, the uncured amido-reactive compound remains in the adhesive layer and the heat resistance of the adhesive layer tend to be decreased. If it is excessive, the curing promoting agent remains in the adhesive layer and the insulating property of the adhesive layer tends to be deteriorated after curing.

Based on the necessity, the adhesive may contain a rubber type elastomer, a phosphorus type compound as a flame retardant, an inorganic filler, a coupling agent, a pigment, a leveling agent, a defoaming agent, and an ion trapping agent.

Examples of the organic solvent to dissolve the adhesive in are ketones such as acetone, methyl ethyl ketone, and cyclohexanone; acetic acid esters such as ethyl acetate, butyl acetate, cellosolve acetate, propylene glycol monomethyl ether acetate, and carbitol acetate; cellosolves such as cellosolve and butyl cellosolve; carbitols such as carbitol and butylcarbitol; aromatic hydrocarbons such as toluene and xylene; dimethylformamide, dimethylacetamide, and N-methylpyrrolidone, however the solvent is not limited to these exemplified solvents. One or more kinds of these solvents may be used. It is required to select the system to sufficient dissolve the solid content.

The adhesive may be diluted in the above-mentioned organic solvents so as to adjust the solid content in a concentration of about 10%. A core substrate may be immersed in the obtained diluted solution and dried to form an adhesive layer (FIG. 2(g) and FIG. 3(g)).

Next, as shown in FIG. 1(h), FIG. 2(h), and FIG. 3(h), a one-side metal foil-bearing resin is laminated on the core substrate. The resin thickness (the insulating layers 9, 109, and 209) of the one-side metal foil-bearing resin is about 10 to 100 µm, preferably 20 to 60 µm. The same resin compositions as those for the above-mentioned insulating layers 1, 101, and 201 can be used. The thickness of the metal foils 10, 110, and 210 is preferably 0.3 to 3 µm and the metal foils similar to those of the metal foils 2, 102, and 202 of the laminate plates can be used. The resin and the solvents in form of resin varnish may be applied to the metal foils by using a kiss coater, a roll coater, or a comma coater. Or, a film-like resin may be laminated on the metal foils. In the case the resin varnish is applied to the metal foils, the resulting laminates are heated and dried thereafter. The conditions are preferably at 100 to 200° C. and 1 to 30 minutes. The amount of the remaining solvent in the resin composition after the heating and drying is preferably 0.2 to 10%. In the case the film-like resin is laminated on the metal foil, the conditions are preferably at 50 to 150° C. and 0.1 to 5 MPa vacuum or atmospheric pressure. Further, there is a laminating and pressing method of the core substrate, prepreg, and copper foils. In this case also, based on the necessity, the adhesive layers 111 may be formed by applying the adhesive to the copper foils before the insulating layer application. Usable adhesives, the thickness or the like are same as those in the case of the above-mentioned adhesive layer 103 (FIG. 2(h)).

Next, IVH 12, 112, and 212 are formed in the inter resin insulating layers from the metal foils as shown in FIG. 1(i), FIG. 2(i), and FIG. 3(i). For the IVH formation method, laser is preferable to be used. As the laser to be employed in this case, gas laser of $CO_2$, CO, and excimer laser, and solid laser such as YAG laser are available. As laser beam source, known laser such as $CO_2$ laser, UV-YAG laser, and excimer laser can be employed and $CO_2$ laser has a high processing speed and is therefore preferable and UV-YAG laser is suitable for forming via holes with small diameters and is therefore preferable. Since high output can be obtained easily, $CO_2$ laser is suitable for processing IVH with ϕ50 µm or larger. In the case of processing fine IVH with ϕ50 µm or smaller, YAG laser with shorter wavelength and excellent in the beam concentration. As a laser hold formation method, a method using a conformal mask and direct laser processing method are available. The method using a conformal mask is a method involving forming openings at sites of metal foils where via holes are to be formed by etching and removing the interlayer insulating resin layer by radiating laser beam with a larger diameter than that of the opening by using the metal foils as a mask. The direct laser processing method is a method for forming holes by radiating laser beam converged to have a via hole diameter directly to the metal foils. In the case of the direct laser processing, in order to increase the laser absorption ratio in the metal foil surface, surface roughening treatment or blackening treatment may be carried out. In such a laser processing, if the peel strength between the metal foils and the interlayer insulating layers is lower than 0.5 kN/m, the metal foils in the periphery of the via hole are easily peeled and condition setting of the laser becomes difficult. If the peel strength is 0.5 kN/m or higher, the metal peeling hardly occurs, and the peel strength is preferably 0.8 kN/m or higher. Since smear is caused in such via holes, it is preferable to remove the smear by using permanganic acid salt, chromic acid salt, or permanganic acid. Here, the peel strength means the force required to peel the metal foils at 50 mm/min in the vertical direction and expressed on the basis of load per unit width (kN/m).

Next, the resin residue in the inside of the IVH is removed by using permanganic acid salt, chromic acid salt, or permanganic acid.

Next, a catalyst core is supplied to the metal foils and the IVH insides. To supply the catalyst core, a noble metal ion or palladium colloid is used.

Next, as shown in FIG. 1(j), FIG. 2(j), and FIG. 3(j), thin electroless plating layers 13, 113, and 213 are formed on the metal foils and IVH insides to which the catalyst core is supplied. For the electroless plating, commercialized electroless copper plating solutions such as CUST 2000 (trade name, manufactured by Hitachi Chemical Co., Ltd.) and CUST 201 (trade name, manufactured by Hitachi Chemical Co., Ltd.) can be employed, however the plating is not limited to the examples. These electroless copper plating solutions contain mainly copper sulfate, formalin, a complexing agent, and sodium hydroxide. The thickness of the plating is sufficient if the next electroplating can be carried out thereon and it is about 0.1 to 1 µm.

Next, as shown in FIG. 1(k), FIG. 2(k), and FIG. 3(k), plating resist 14, 114, and 214 is formed on the electroless plating layers. The thickness of the plating resist is preferably as same as or thicker than the thickness of a conductor for planting thereafter. Examples of the resin to be used for the plating resist are liquid phase resist such as PMER P-LA900PM (trade name; manufactured by Tokyo Ohka Kogyo Co., Ltd.) and dry films such as HW-425 (trade name, manufactured by Hitachi Chemical Co., Ltd.) and RY-3025 (trade name, manufactured by Hitachi Chemical Co., Ltd.). The plating resist should not be formed on the portions to be via holes and a conductor circuit.

Next, as shown in FIG. 1(l), FIG. 2(l), and FIG. 3(l), circuit patterns 15, 115, and 215 are formed by electroplating. A copper sulfate electroplating to be used commonly for a printed wiring board may be used. The thickness of the plating is sufficient if it is used as a circuit conductor and preferably in a range of 1 to 100 µm, more preferably in a range of 5 to 50 µm.

Next, the resist is separated by an alkaline separation solution, sulfuric acid, or a commercialized resist separation solution.

Next, copper in the portions other than the pattern parts is removed by an etching solution containing sulfuric acid in a concentration of 10 to 300 g/L and hydrogen peroxide in a concentration of 10 to 200 g/L as main components to complete circuit formation (FIG. 1(m), FIG. 2(m), and FIG. 3(m))

Further, as shown in FIG. 2(n), FIG. 2(n), and FIG. 3(n), gold plating 16, 116, and 216 may be carried out on the circuit. As a gold plating method, steps may be carried out as follows: the conductor interface is activated by an activation solution such as SA-100 (trade name; manufactured by Hitachi Chemical Co., Ltd.); an electroless nickel plating in a thickness of 1 to 10 µm is carried out by using NIPS-100 (trade name; manufactured by Hitachi Chemical Co., Ltd.); a displacement gold plating in a thickness of 0.01 to 0.1 µm is carried out by using HGS-100 (trade name; manufactured by Hitachi Chemical Co., Ltd.); and then an electroless gold plating in a thickness of about 0.1 to 1 µm is carried out. Since the resin layer is flat in the invention, the electroless nickel deposition and displacement plating gold deposition on the resin can be suppressed. Further, if electroless palladium plating is carried out between the electroless nickel plating and electroless gold plating as described in Japanese Patent Application Laid-Open No. 11-140659, the connection reliability is further improved. The electroless palladium plating may be carried out to be about 0.01 to 1 μm thick by using Pallet (trade name; KOJIMA Chemical Co., Ltd.). In consideration of the electric properties, the electroless nickel plating may be eliminated. These combinations may differ depending on the uses of the product and determined based on the cost, electric properties, and connection reliability. The invention is effective in cases of employing any of the above-mentioned techniques. The disclosure of Japanese Patent Application Laid-Open No. 11-140659 is expressly incorporated herein by reference its entirety.

In terms of the practical usability of the printed wiring board and suppression of the defects in the process, the peel strength of the conductor circuit with a width of 1 mm from the insulating resin layer is preferably 0.6 kN/m or higher and the peel strength of the conductor circuit with a width of 1 mm from the insulating resin layer is further preferably 0.4 kN/m or higher after heating at 150° C. for 240 hours.

EXAMPLES

Hereinafter, the embodiments of the invention will be described along with FIGS. 1(a) to 1(f).

Example 1A

The following metal foil A was produced.
Metal Foil A

Chromium plating was continuously carried out on the bright face of an electrolytic copper foil (a carrier copper foil) with a width of 510 mm and a thickness of 35 μm in the following conditions to form a chromium plating layer (a separation layer) with a thickness of 1.0 mg/dm². The surface roughness (ten-point mean surface roughness) Rz after the chromium plating formation was 0.5 μm. The surface roughness was measured according to JIS-B-0601.

Solution composition: chromium trioxide 250 g/L and sulfuric acid 2.5 g/L,
Bath temperature: 25° C.,
Anode: lead, and
Electric current density: 20 A/dm².

Next, electric copper plating in a thickness of 2.0 μm was carried out in the following bright conditions. The metal foil surface roughness Rz after the electric copper plating was 0.6 μm.

Solution composition: copper sulfate pentahydrate 100 g/L, sulfuric acid 150 g/L, and chloride ion 30 ppm,
Bath temperature: 25° C.,
Anode: lead, and
Electric current density: 10 A/dm².

Next, zinc anti-rust treatment was carried out by electric plating in the following bright conditions.

Solution composition: zinc 20 g/L and sulfuric acid 70 g/L,
Bath temperature: 40° C.,
Anode: lead,
Electric current density: 15 A/dm².
Electrolytic time: 10 seconds.

Next, successively the following chromate treatment was carried out.

Solution composition: chromic acid 5.0 g/L,
pH: 11.5,
Bath temperature: 55° C.,
Anode: lead, and
Immersion period: 5 seconds.

Next, the following silane coupling treatment was carried out.

Solution composition: 3-aminopropyltrimethoxysilane 5.0 g/L,
Bath temperature: 25° C., and
Immersion period: 10 seconds.

After silane coupling treatment, the metal foil was dried at 120° C. to adsorb the coupling agent to the metal foil surface to obtain a metal foil A. The metal foil surface roughness Rz was 0.6 μm at that time.

The following resin composition B was produced. The resin composition B was used for an insulating layer later.

Resin Composition B

Polyphenylene ether resin (trade name: PKN 4752, manufactured by GE Plastics Japan Ltd.) 20% by weight, 2,2-bis(4-cyanatophenyl)propane (trade name: Arocy B-10, manufactured by Asahi Ciba Co., Ltd.) 40% by weight, a phosphorus-containing phenol compound (trade name: HCA-HQ, Sanko Co., Ltd.) 8% by weight, manganese naphthenate (Mn content=6% by weight, manufactured by Nihon Kagaku Sangyo Co., Ltd.) 0.1% by weight, 2,2-bis(4-glycidylphenyl)propane (trade name: DER 331L, manufactured by Dow Chemical Japan Ltd.) 32% by weight were dissolved in toluene at 80° C. to obtain polyphenylene ether cyanate type resin composition varnish, which was the resin composition B.

Next, a glass cloth with a thickness of 0.2 mm was immersed in the resin composition B and dried at 120° C. for 5 minutes to obtain a prepreg. Four sheets of the prepreg were laminated and the metal foils A were laminated on the top and bottom of the obtained laminate and the resulting laminate was press-formed at 170° C. and 2.45 MPa for 1 hour and the carrier foils on the copper foils were peeled to obtain a copper-clad laminated board comprising the insulating layer (the prepreg layer) 1 and the metal foils 2 as shown in FIG. 1(a).

As shown in FIG. 1(b), a penetrating through hole 4 with a diameter 80 μm was formed by a carbon dioxide gas impact laser hole forming apparatus L-500 (trade name, manufactured by Sumitomo Heavy Industries, Ltd.) through the metal foil the insulating layer, and smear was removed by immersing the board in an aqueous solution mixture of potassium permanganate 65 g/L and sodium hydroxide 40 g/L at a solution temperature of 70° C. for 20 minutes.

After that, HS-201B (trade names; manufactured by Hitachi Chemical Co., Ltd.), which is a palladium catalyst, was supplied and then using CUST-201 (trade names; manufactured by Hitachi Chemical Co., Ltd.), electroless copper plating was carried out at a solution temperature of 25° C. for 30 minutes to form 0.5 μm-thick electroless copper plating layers 5 as shown in FIG. 1(c). The palladium catalyst supply conditions are shown in Table 1.

TABLE 1

| Treatment Step | Treatment Solution | Treatment Condition |
| --- | --- | --- |
| Cleaner | CLCc-501 | 60° C., 5 min |
| Warm Water Washing | Pure Water | 40° C., 4 min |
| Etching | Ammonium Peroxodisulfate 187 g/l | 25° C., 10 sec. |
| Flowing Water Washing | Pure Water | 25° C., 3 min. |
| Acid Treatment | 10 Vol. % Sulfuric Acid | 25° C., 3 min. |
| Flowing Water Washing | Pure Water | 25° C., 3 min. |
| Catalyst Supply Pretreatment | PD301 | 25° C., 2 min. |
| Catalyst Supply Treatment | HS201-B | 25° C., 8 min. |
| Flowing Water Washing | Pure Water | 25° C., 3 min. |

TABLE 1-continued

| Treatment Step | Treatment Solution | Treatment Condition |
|---|---|---|
| Adhesion Promoting Agent | ADP-201 | 25° C., 4 min. |
| Flowing Water Washing | Pure Water | 25° C., 2 min. |

As shown in FIG. 1(d), RY-3325 (trade names; manufactured by Hitachi Chemical Co., Ltd.), which is a dry film photoresist, was laminated on the surface of the electroless plating layers 5 and through a photomask masking the parts on which electric copper plating was to be carried out, UV exposure was carried out and the exposed parts were developed to form plating resist 6.

As shown in FIG. 1(e), electric copper plating in a thickness of about 20 μm was carried out by using a copper sulfate bath in conditions of a solution temperature of 25° C. and a current density of 1.0 A/dm$^2$ to form a circuit pattern 7 with the minimum circuit conductor width/circuit conductor interval (L/S)=23/17 μm.

Next, as shown in FIG. 1(f), after the dry film was removed by HTO (trade name; manufactured by Nichigo-Morton Co., Ltd.), which is a resist separation solution, Cu in portions other than the pattern parts was removed by etching using an etching solution with a composition of $H_2SO_4$ 100 g/L and $H_2O_2$ 10 g/L to produce an inner layer substrate.

Next, electroless gold plating 20 (not illustrated) was carried out in the outermost layer to complete the substrate. The electroless gold plating conditions are shown in Table 2.

TABLE 2

| Step | Solution | Concentration | Solution Temperature | Immersion Time |
|---|---|---|---|---|
| Degreasing | Z-200 | | 60° C. | 1 min. |
| Water Washing | | | 25° C. | 2 min. |
| Soft Etching | Ammonium Peroxodisulfate | 100 g/L | 25° C. | 1 min. |
| Water Washing | | | 25° C. | 2 min. |
| Acid Washing | Sulfuric Acid | 10 vol % | 25° C. | 1 min. |
| Water Washing | | | 25° C. | 2 min. |
| Activation Treatment | SA-100 | | 25° C. | 5 min. |
| Water Washing | | | 25° C. | 2 min. |
| Electroless Nickel Phosphorus Plating | NIPS-100 | | 85° C. | 20 min. |
| Water Washing | | | 25° C. | 2 min. |
| Electroless Nickel Boron Plating | Top Chemi Alloy 66 | | 65° C. | 5 min. |
| Water Washing | | | 25° C. | 2 min. |
| Electroless Nickel Palladium Plating | Pallet | | 70° C. | 5 min. |
| Water Washing | | | 25° C. | 2 min. |
| Displacement Gold Plating | HGS-100 | | 85° C. | 10 min. |
| Water Washing | | | 25° C. | 2 min. |
| Electroless Gold Plating | HGS-2000 | | 65° C. | 40 min. |

Remarks)
Z-200 (trade name: manufactured by World Metal Co., Ltd.)
SA-100 (trade names; manufactured by Hitachi Chemical Co., Ltd.)
NIPS-100 (trade names; manufactured by Hitachi Chemical Co., Ltd.)
Top Chemi Alloy 66 (trade names; manufactured by Okuno Chemical Industries Co., Ltd.)
Pallet (trade name; KOJIMA Chemicals Co., Ltd.)
HGS-100 (trade names; manufactured by Hitachi Chemical Co., Ltd.)
HGS-2000 (trade names; manufactured by Hitachi Chemical Co., Ltd.)

Comparative Example 1A

A substrate was produced in the same manner as Example 1, except that Microsyn (trade name: Mitsui Mining and Smelting Co., Ltd.) with 3.0 μm was used n place of the metal foil A. The surface roughness Rz of Microsyn was 3.5 μm. After the etching, the minimum circuit conductor width/circuit conductor interval=15/25 μm.

Measurement Condition
(1) Wiring Finishing

The minimum circuit conductor width/circuit conductor interval (L/S) was confirmed by processing the images taken by an optical microscope. OLYMPUS MX50 (trade name: manufactured by Olympus Corporation) was used as the optical microscope. MCP-550 (trade name: manufactured by Moritex Corporation) was used for the image processing. The measurement was carried out at aimed finishing L/S=50/50, 40/40, 30/30, 25/25, and 20/20 μm. The results are shown in Table 3.

(2) Evaluation of Gold Plating Deposition Amount on Resin Composition

Figure 4:
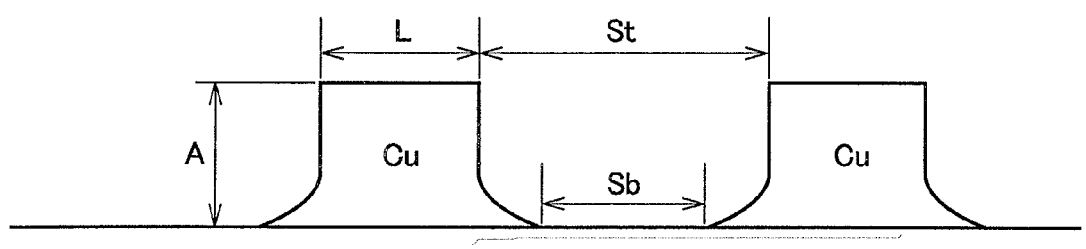
FIG. 4 illustrates an evaluation method of gold plating precipitation amount on a resin.

Nickel/gold plating deposition is not necessarily caused only on the circuit but often caused as to form a train from the circuit as shown in FIG. 4. Therefore, the value calculated by dividing the difference of the top (St) and the bottom (Sb) of the circuit with 2, that is (St−Sb)/2, was quantified as the gold plating deposition amount on the resin. The gold plating deposition amount was confirmed by processing images taken by the optical microscope. The results are the averages of values measured at 20 points respectively. The measurement was carried out at aimed finishing L/S=50/50, 40/40, 30/30, 25/25, and 20/20 μm.

Results

TABLE 3

| Measurement Points | Pitch Aimed | 10 μm | 80 μm | 60 μm | 50 μm | 40 μm |
|---|---|---|---|---|---|---|
| | Finishing | 50/50 μm | 40/40 μm | 30/30 μm | 25/25 μm | 20/20 μm |
| Example 1 | Finishing | 50/50 μm | 40/40 μm | 30/30 μm | 25/25 μm | 20/20 μm |
| | Gold Plating Deposition Amount | 0 μm | 0 μm | 0 μm | 0 μm | 0 μm |

TABLE 3-continued

| Measurement Points | Pitch Aimed Finishing | 10 μm 50/50 μm | 80 μm 40/40 μm | 60 μm 30/30 μm | 50 μm 25/25 μm | 40 μm 20/20 μm |
|---|---|---|---|---|---|---|
| Comparative Example 1 | Finishing | 45/55 μm | 35/45 μm | 25/35 μm | 20/30 μm | 15/25 μm |
| | Gold Plating Deposition Amount | 1 μm | 3 μm | 5 μm | 7 μm | 7 μm |

With respect to the substrate produced in Example 1A, the copper foil hardly remained on the resin layer at the time of etching and therefore, circuit formability was good and wiring was finished with aimed finishing value and further, no gold deposition on the resin was caused. On the other hand, with respect to the substrate produced in Example 1A, it was required to etch the residue of the copper foil on the resin layer at the time of etching, and therefore, wiring top width (L) was made thin. It was found that as the wiring became thinner, the gold plating deposition amount was increased more. It is supposedly attributed to that the wiring becomes thinner, the solution flow or circulation is deteriorated and etching residues are caused.

Figure 2:
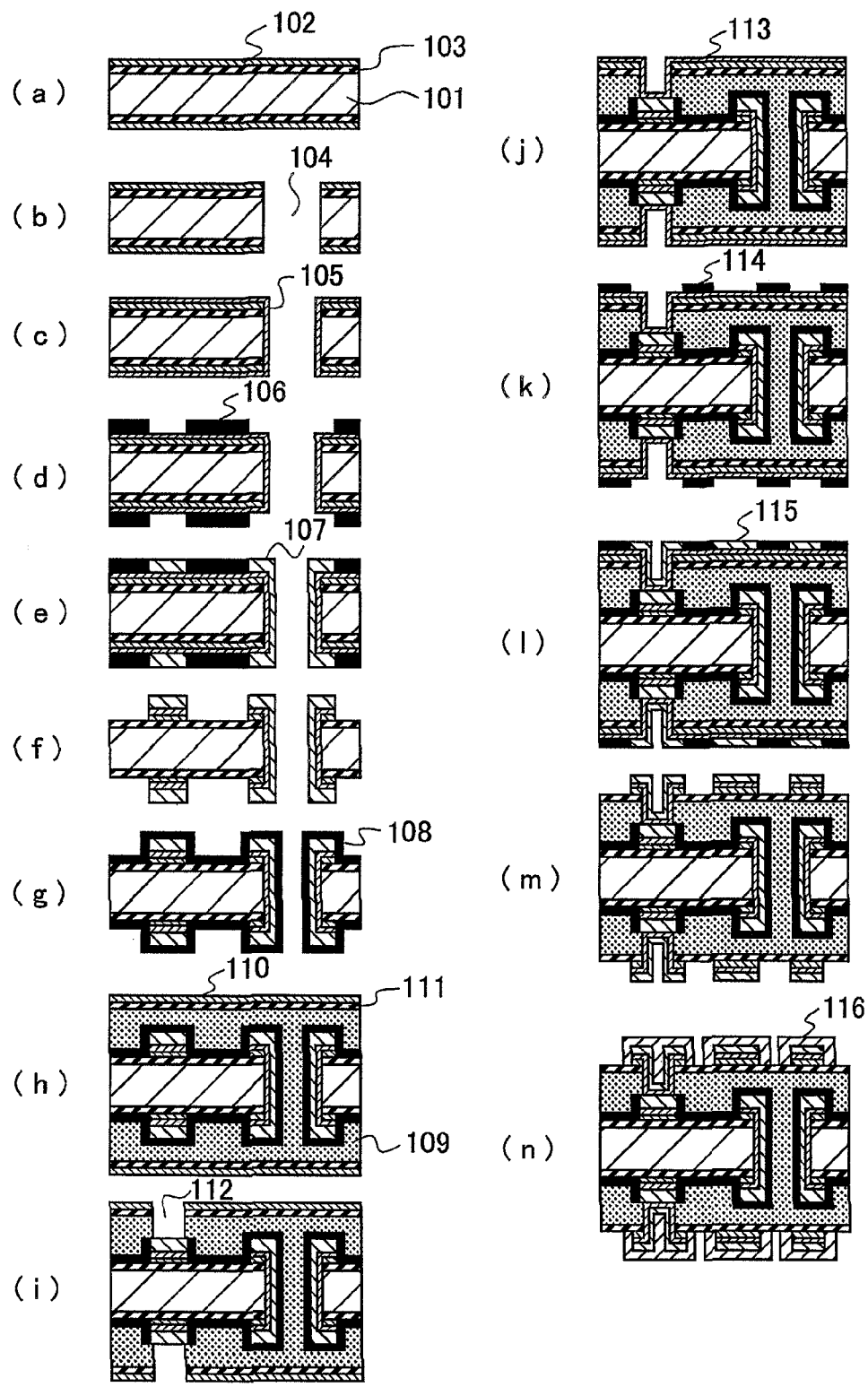
FIG. 2 shows a cross-sectional view showing another embodiment of printed wiring board production process according to the invention.

Hereinafter, another embodiment of the invention will be described along with FIG. 2.

Example 1B

The following resin composition A was produced.
Resin Composition A

A separable flask 500 mL capacity equipped with a Deen/Stark refluxing cooling apparatus, a thermometer, and a stirrer was loaded with (4,4'-diamino)dicyclohexylmethane as an alicyclic diamine compound (trade name: Wondamine HM (abbreviated as WHM), manufactured by New Japan Chemical Co., Ltd.) 45 mmol, a reactive silicone oil X-22-161-B as siloxanediamine (trade name: manufactured by Shin-Etsu Chemical Co., Ltd., amine equivalent 1,500) 5 mmol, trimellitic anhydride (TMA) 105 mmol, and N-methyl-2-pyrrolidone as a non-proton polar solvent 145 g and the mixture was stirred at 80° C. for 30 minutes.

On completion of stirring, toluene 100 mL as an aromatic hydrocarbon azeotropic with water was added and the resulting reaction solution was heated to 160° C. and refluxed for 2 hours. When it was confirmed that a theoretical quantity of water was pooled in a water quantitative reception apparatus and no water flow was observed, water and toluene in the water quantitative reception apparatus were removed and toluene in the reaction solution was removed by heating to 190° C.

After the solution in the flask was cooled to a room temperature, 4,4'-diphenylmethane diisocyanate (MDI) as diisocyanate 60 mmol was added and the temperature was increased to 190° C. and reaction was carried out for 2 hours to obtain an NMP solution of polyamide imide resin. Next, YDCN-500-10 (manufactured by Tohto Kasei Co., Ltd.) as an epoxy resin was added in a proper amount so as to adjust the total solid content concentration to be 10%, and further 2-ethyl-4-methylimidazole as a curing promoting agent was added in a proper amount of 1% by weight on the basis of the solid content of the epoxy resin and the resulting solution was diluted with dimethylacetamide to obtain thermosetting resin varnish (solid content 10%), which was used as the resin composition A.

Next, a metal foil B was produced as follows by using the resin composition A.

Metal Foil B

The resin composition A was applied to the silane coupling agent-treated face of the metal foil A obtained in Example 1A. After the application, the composition A was dried at 160° C. for about 1 minute to decrease the remaining solvent to 1% or less and obtain the metal foil B. The thickness of the applied resin composition A was 2.0 μm.

A glass cloth with a thickness of 0.2 mm (basic weight, Hyoryo: 210 g/m$^2$) was immersed in the resin composition B obtained in Example 1A and dried at 120° C. for 5 minutes to obtain prepreg. Four sheets of the prepreg were laminated and the metal foils B were laminated on the top and bottom of the obtained laminate in such a manner that the faces coated with the resin composition A were in the prepreg sides and the resulting laminate was press-formed at 170° C. and 2.45 MPa for 1 hour and the carrier foils on the copper foils were peeled to obtain a copper-clad laminated board comprising the insulating layer 101, the adhesive layers 103, and the metal foils 102 as shown in FIG. 2(a).

Next, an inner layer substrate (a core substrate) was produced similarly to Example 1A (FIG. 2(f)).

Next, the entire body of the substrate was immersed in the solution of the resin composition A, pulled out, and dried at 160° C. for 10 minutes to coat the entire body of the substrate with the resin composition A as shown in FIG. 2(b) to form adhesive layers 108. The coating thickness was about 2 μm after drying.

Next, the resin composition B was applied to the metal foils B and dried at 160° C. for 5 minutes. The coating thickness was about 2 μm after drying. The resin composition B side of the copper foils B after the resin coating and the adhesive layers 108 were press-formed at 170° C. and 2.45 MPa for 1 hour and then the carrier foils on the copper foils were peeled to produce the substrate shown in FIG. 2(h). Accordingly, the insulating layers 109, the adhesive layers 111, and the metal foils 110 were formed.

As shown in FIG. 1(i), an IVH 112 with a diameter 50 μm was formed by a carbon dioxide gas impact laser hole forming apparatus L-500 (trade name, manufactured by Sumitomo Heavy Industries, Ltd.) from the metal foil and smear was removed by immersing the board in an aqueous solution mixture of potassium permanganate 65 g/L and sodium hydroxide 40 g/L at a solution temperature of 70° C. for 20 minutes.

After that, HS-201B (trade names; manufactured by Hitachi Chemical Co., Ltd.), which is a palladium catalyst, was supplied and then using CUST-201 (trade names; manufactured by Hitachi Chemical Co., Ltd.), electroless copper plating was carried out at a solution temperature of 25° C. for 30 minutes to form 0.5 μm-thick electroless copper plating layers 113 as shown in FIG. 1(c). The palladium catalyst supply conditions were as shown in Table 1.

As shown in FIG. 2(k), RY-3325 (trade names; manufactured by Hitachi Chemical Co., Ltd.), which is a dry film photoresist, was laminated on the surface of the electroless plating layers 5 and through a photomask masking the parts on which electric copper plating was to be carried out, UV exposure was carried out and the exposed parts were developed to form plating resist 114.

As shown in FIG. 2(i), electric copper plating in a thickness of about 20 µm was carried out by using a copper sulfate bath in conditions of a solution temperature of 25° C. and a current density of 1.0 A/dm² to form a circuit pattern 115 with the minimum circuit conductor width/circuit conductor interval (L/S)=23/17 µm.

Next, as shown in FIG. 2(m), after the dry film was removed by HTO (trade name; manufactured by Nichigo-Morton Co., Ltd.), which is a resist separation solution, Cu in portions other than the pattern parts was removed by etching using an etching solution with a composition of $H_2SO_4$ 100 g/L and $H_2O_2$ 10 g/L to produce an inner layer substrate.

The minimum circuit conductor width/circuit conductor interval (L/S) after the etching was 20/20 µm.

Next, as shown in FIG. 2(n), electroless gold plating 116 was carried out in the outermost layer. The electroless gold plating conditions were as shown in Table 2.

Example 2B

A substrate was produced in the same manner as Example 1B, except that GEA-679-FG, which is prepreg with 60 µm thickness and metal foils B were laminated on the inner substrate in place of application and heating of the resin composition B after the coating in the step G.

Example 3B

A substrate was produced in the same manner as Example 1B, except that GEA-679-F, which is prepreg with 60 µm thickness and metal foils B were laminated on the inner substrate in place of application and heating of the resin composition B after the coating in the step G.

Example 4B

A substrate was produced in the same manner as Example 1B, except that the resin composition A was applied in a proper amount so as to adjust the thickness to be 5 µm at the time of forming the adhesive layers by applying the resin composition A to the silane coupling agent-treated faces of the metal foils A, that is at the time of producing the metal foil B.

Example 5B

A substrate was produced in the same manner as Example 1B, except that the resin composition A was applied in a proper amount so as to adjust the thickness to be 6 µm at the time of forming the adhesive layers by applying the resin composition A to the silane coupling agent-treated faces of the metal foils A, that is at the time of producing the metal foil B.

Comparative Example 1B

A substrate was produced in the same manner as Example 1B, except that the resin composition A was not applied in the step G.

Comparative Example 2B

A substrate was produced in the same manner as Example 1B, except that GEA-679-FG, which is prepreg with 60 µm thickness and metal foils A were laminated on the inner layer substrate coated with the resin composition A in place of press-formation of the metal foils B coated with the resin composition B after the coating in the step G.

Production of Sample for Evaluation of Properties

Test specimens for measuring the physical properties, dielectric constant, and dielectric dissipation factor of the insulating layer in the outermost layer were produced. Samples for evaluating the properties of the insulating layer in the outermost layer were produced.

Sample for Evaluation of Properties for Example 1B

The resin composition A was applied in a thickness of 2 µm to a both sides-untreated 18 µm-thick copper foil (Rz=0.6 µm) and the resin composition B was applied in a thickness of 40 µm on the metal foil B and both foil were laminated in such a manner that the resin faces are stuck to each other and the resulting laminate was press-formed at 170° C. and 2.45 MPa for 1 hour and the entire face of the copper foil was etched to produce a sample for property evaluation.

Sample for Evaluation of Properties for Example 2B

The resin composition A was applied in a thickness of 2 µm to a both sides-untreated 18 µm-thick copper foil (Rz=0.6 µm) and GEA-679-FG, which is prepreg with a thickness of 60 µm and the metal foil B were successively laminated thereon and the resulting laminate was press-formed at 170° C. and 2.45 MPa for 1 hour and the entire face of the copper foil was etched to produce a sample for property evaluation.

Sample for Evaluation of Properties for Example 3B

A sample was produced in the same manner as the sample for property evaluation for Example 2B, except that GEA-679-E was used in place of GEA-679-FG.

Sample for Evaluation of Properties for Example 4B

A sample was produced in the same manner as the sample for property evaluation for Example 1B, except that coating was carried out in a thickness of 5 µm using the resin composition A at the time of producing the metal foil B.

Sample for Evaluation of Properties for Example 5B

A sample was produced in the same manner as the sample for property evaluation for Example 1B, except that coating was carried out in a thickness of 6 µm using the resin composition A at the time of producing the metal foil B.

Sample for Evaluation of Properties for Comparative Example 1B

A sample was produced in the same manner as the sample for property evaluation for Example 1B, except that both sides-untreated 18 µm-thick copper foil (Rz=0.6 µm) was not coated with the resin composition A.

Sample for Evaluation of Properties for Comparative Example 2B

A sample was produced in the same manner as the sample for property evaluation for Example 2B, except that the metal foil A was used in place of the metal foil B.

Test Method

Measurement of Thermal Expansion Coefficient

The thermal expansion coefficient of the samples for evaluation of properties was measured by a TMA (thermomechanical analyzer) test for the samples for evaluation of properties respectively cut into strips (20 mm×5 mm). The measurement was carried out at 20° C. in biaxial direction (X-direction and Y direction). The measurement was carried out twice for each sample and the value at the second time was employed as data. The TMA (thermomechanical analyzer) test is shown in Table 4.

TABLE 4

TMA (Thermomechanical Analyzer) Test Condition

| Item | Condition |
| --- | --- |
| Apparatus | TMA 2940, manufactured by Du Pont Ltd. |
| Measurement Temperature | 0° C.~150° C., 10° C./min. |
| Mode, Load | Tensile, 5 g |

Measurement of Tensile Strength

The tensile strength of the samples for evaluation of properties was measured by a tensile strength test for the samples for evaluation of properties respectively cut into a strip-like shape. The measurement was carried out at 20° C. in biaxial direction (X-direction and Y direction) and the average was calculated. The tensile strength test conditions are shown in Table 5.

TABLE 5

Tensile Strength Test Condition

| Item | Condition |
| --- | --- |
| Apparatus | 5-t Tensilon RTC-1350A, manufactured by Orientech Co., Ltd. |
| Speed/Span | 0.5 mm/min./100 mm |
| Specimen Size | 220 mm × 10 mm |

Measurement of Dielectric Constant and Dielectric Dissipation Factor

The dielectric constant and dielectric dissipation factor of each sample for evaluation of properties were measured. The measurement was carried out at 20° C. The measurement conditions are shown in Table 6.

TABLE 6

Condition of Dielectric Constant and Dielectric Dissipation Factor Test

| Item | Condition |
| --- | --- |
| Apparatus | Impedance/Material analyzer HP4291, manufactured by Hewlett-Packard Development Company, L.P. |
| Measurement Frequency | 1 $GH_z$ |
| Specimen Size | 25 mn × 25 mn |

Measurement of Conductor Circuit Peel Strength

The outer layer conductor circuit peel strength of the substrates produced in Examples 1B to 3B and Comparative Examples 1B and 2B was measured. The vertical peel strength was measured as the peel strength. The peel strength was measured as initial values and values after heating at 150° C. for 240 hours. The measurement was carried out constantly at 20° C. The measurement conditions are shown in Table 7.

TABLE 7

Test Conditions for Conductor Circuit Peel Strength

| Item | Condition |
| --- | --- |
| Apparatus | Autograph AC-100C, manufactured by Shimadzu Corporation |
| Peeling Speed | 50 mm/min. |
| Test Width | 1 mm |

Connection Reliability Evaluation

Figure 5:
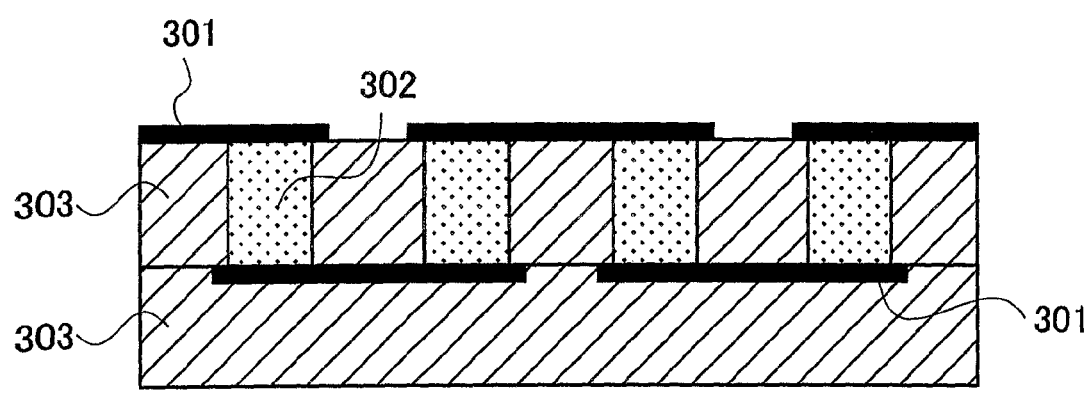
FIG. 5 shows a cross-sectional view of a substrate for connection reliability evaluation.

The connection reliability evaluation of the substrates produced in Examples 1B to 5B and Comparative Examples 1B and 2B was carried out. The patterns shown in FIG. 5 were used for the evaluation. In Table 5, a conductor circuit 301, an IVH 302, and an insulating layer 303 are shown. The designs of the patterns shown in FIG. 5 are shown in Table 8. The connection reliability was evaluated by repeating cooling and heating cycle of −60° C. for 30 min and at 125° C. for 30 min 1,000 times and if the resistance value alteration was in ±10% of the initial value, the connection reliability was determined to be qualified.

TABLE 8

Design of Connection Reliability Evaluation Pattern

| | Unit | Employed |
| --- | --- | --- |
| IVH Diameter | μm | 80 |
| IVH Pitch | mm | 1.27 |
| Inner Layer Pad Diameter | μm | 150 |
| Outer Layer Land Diameter | μm | 150 |
| IVH Number | holes | 400 |

Moisture Absorption Heat Resistant Test

The substrates obtained in Examples 1B to 5B and Comparative Examples 1B and 2B were subjected to the moisture absorption heat resistant test. The test was carried out by treating the respective substrates in conditions of 121° C., 100% humidity, 2 atmospheric pressure, and 96 hours and confirming whether blister occurred or not. A saturated type PCT apparatus PC-242 manufactured by Hirayama Manufacturing Corp. was employed.

Test Results

The evaluation results of the substrates obtained in Examples 1B to 5B and Comparative Examples 1B and 2B are shown in Table 9. The substrates obtained in Examples 1B to 5B were found having high copper foil peel strength and good reliability in the moisture absorption heat resistant test. On the other hand, the substrate of Comparative Examples 1B was found causing troubles such as blister between the inner circuit and the insulating layer in the reliability test since no adhesive layer coating was carried out on the inner circuit in the substrate. Also, the substrate of Comparative Examples 2B was found having high peel strength of the copper foil and insufficient reliability.

TABLE 9

| Test Item | Thermal expansion | | Tensile Strength | Dielectric Constant | Dielectric Dissipation | Copper Foil Peel Strength | | Reliability Test | |
|---|---|---|---|---|---|---|---|---|---|
| | CTE X | CTE Y | | | | Before Heating | After Heatin | Connection Reliability | Moisture Absorption |
| Unit | (ppm/° C.) | (ppm/° C.) | $MP_a$ | — | — | KN/m | KN/m | — | — |
| Example 1 | 50 | 50 | 60 | 2.8 | 0.005 | 1.5 | 1.3 | Good | No particular |
| Example 2 | 13 | 15 | 290 | 4.8 | 0.014 | 1.5 | 1.4 | Good | No particular |
| Example 3 | 11 | 12 | 290 | 4.7 | 0.014 | 1.5 | 1.4 | Good | No particular |
| Example 4 | 47 | 47 | 62 | 3.0 | 0.007 | 1.5 | 1.4 | Good | No particular |
| Example 5 | 47 | 47 | 62 | 3.1 | 0.008 | 1.5 | 1.4 | Poor | No particular |
| Comparative Example 1 | 51 | 51 | 60 | 2.7 | 0.004 | 1.5 | 1.4 | Poor | Blister |
| Comparative Example 2 | 13 | 15 | 290 | 4.8 | 0.014 | 0.4 | 0 | Poor | Blister |

Further, in various properties, the substrate of Example 1B had a low dielectric constant and dielectric dissipation factor of the insulating layer and was therefore expected to have good electric properties. The substrates of Example 2B and 3B had a low dielectric constant and a high tensile strength and were therefore expected to have good disposition reliability.

Further, an embodiment of the invention will be described along with FIG. 2.

Example 1C

The metal foil B was produced in the same manner as Example 1B, except that the thickness after drying was changed to be 1.0 μm from 2.0 μm. After that, a core substrate was produced in the same manner as Example 1B (FIG. 2(f)). The surface roughness Rz of the insulating layer of the core substrate was 0.5 μm and the surface roughness Rz of the conductor circuit was 1.2 μm. The surface roughness was measured according to JIS-B-0601.

Next, the entire body of the substrate was immersed in the solution of the resin composition A, pulled out, and dried at 160° C. for 10 minutes to decrease the remaining solvent to 1% or lower and coat the entire body of the substrate with the resin composition A as shown in FIG. 2(g). The coating thickness was about 2 μm after drying.

GEA-679-FG, which is 60 μm-thick prepreg, (trade names; manufactured by Hitachi Chemical Co., Ltd.) and metal foils B composed of an adhesive layer 111 and the metal layer 110 were laminated on the core substrate after the coating and the resulting laminate was press-formed at 170° C. and 2.45 MPa for 1 hour and then the carrier foils on the copper foils were peeled to obtain a substrate as shown in FIG. 2(h).

After that a printed wiring board was produced in the same manner as that of Example 1B (FIG. 2(n)).

Example 2C

A substrate was produced in the same manner as Example 1C, except that the resin composition A was produced in the following production method.
Resin Composition A-2

A separable flask 500 mL capacity equipped with a Deen/Stark refluxing cooling apparatus, a thermometer, and a stirrer was loaded with (4,4'-diamino)dicyclohexylmethane as an alicyclic diamine compound (trade name: Wondamine HM (abbreviated as WHM), manufactured by New Japan Chemical Co., Ltd.) 140 mmol, Jeffamine D-2000 (trade name: manufactured by Sun Techno Chemical Co., Ltd.) as an aliphatic diamine 35 mmol, trimellitic anhydride (TMA) 368 mmol, and N-methyl-2-pyrrolidone (NMP) as a non-proton polar solvent 413 g and the mixture was stirred at 80° C. for 30 minutes.

On completion of stirring, toluene 120 mL as an aromatic hydrocarbon azeotropic with water was added and the resulting reaction solution was heated to 160° C. and refluxed for 2 hours. When it was confirmed that a theoretical quantity of water was pooled in a water quantitative reception apparatus and no water flow was observed, water and toluene in the water quantitative reception apparatus were removed and toluene in the reaction solution was removed by heating to 190° C.

After the solution in the flask was cooled to a room temperature, 4,4'-diphenylmethane diisocyanate (MDI) as diisocyanate 210 mmol was added and the temperature was heated to 190° C. and reaction was carried out for 2 hours to obtain an NMP solution of polyamide imide resin. Next, YDCN-500-10 (manufactured by Tohto Kasei Co., Ltd.) as an epoxy resin was added in a proper amount so as to adjust the total solid content concentration to be 10%, and further 2-ethyl-4-methylimidazole as a curing promoting agent was added in a proper amount of 1% by weight on the basis of the solid content of the epoxy resin and the resulting solution was diluted with dimethylacetamide to obtain thermosetting resin varnish (solid content 10%).

Example 3C

A substrate was produced in the same manner as Example 1C, except that the resin composition A was produced in the following production method.
Resin Composition A-3

A separable flask 500 mL capacity equipped with a Deen/Stark refluxing cooling apparatus, a thermometer, and a stirrer was loaded with Jeffamine D-2000 (trade name: manufactured by Sun Techno Chemical Co., Ltd.) as an aliphatic diamine 30 mmol, reactive Silicone Oil X-22-161-B (trade name: manufactured by Shin-Etsu Chemical Co., Ltd., amine equivalent 1,500) as siloxanediamine 10 mmol, (4,4'-diamino)diphenylmethane (abbreviated as DDM) as an aromatic diamine 60 mmol, trimellitic anhydride (TMA) 210 mmol, and N-methyl-2-pyrrolidone (NMP) as a non-proton polar solvent 407 g and the mixture was stirred at 80° C. for 30 minutes.

On completion of stirring, toluene 100 mL as an aromatic hydrocarbon azeotropic with water was added and the resulting reaction solution was heated to 160° C. and refluxed for 2 hours. When it was confirmed that a theoretical quantity of water was pooled in a water quantitative reception apparatus and no water flow was observed, water and toluene in the water quantitative reception apparatus were removed and toluene in the reaction solution was removed by heating to 190° C.

After the solution in the flask was cooled to a room temperature, 4,4'-diphenylmethane diisocyanate (MDI) as diisocyanate 210 mmol was added and the temperature was heated to 190° C. and reaction was carried out for 2 hours to obtain an NMP solution of polyamide imide resin. Next, YDCN-500-10 (manufactured by Tohto Kasei Co., Ltd.) as an epoxy resin was added in a proper amount so as to adjust the total solid content concentration to be 10%, and further 2-ethyl-4-methylimidazole as a curing promoting agent was added in a proper amount of 1% by weight on the basis of the solid content of the epoxy resin and the resulting solution was diluted with dimethylacetamide to obtain thermosetting resin varnish (solid content 10%).

Example 4C

A substrate was produced in the same manner as Example 1C, except that the resin composition A was produced in the following production method.

Resin Composition A-4

A separable flask 500 mL capacity equipped with a Deen/Stark refluxing cooling apparatus, a thermometer, and a stirrer was loaded with Jeffamine D-2000 (trade name: manufactured by Sun Techno Chemical Co., Ltd.) as an aliphatic diamine 30 mmol, (4,4'-diamino)diphenylmethane (abbreviated as DDM) as an aromatic diamine 120 mmol, trimellitic anhydride (TMA) 315 mmol, and N-methyl-2-pyrrolidone (NMP) as a non-proton polar solvent 442 g and the mixture was stirred at 80° C. for 30 minutes.

On completion of stirring, toluene 100 mL as an aromatic hydrocarbon azeotropic with water was added and the resulting reaction solution was heated to 160° C. and refluxed for 2 hours. When it was confirmed that a theoretical quantity of water was pooled in a water quantitative reception apparatus and no water flow was observed, water and toluene in the water quantitative reception apparatus were removed and toluene in the reaction solution was removed by heating to 190° C.

After the solution in the flask was cooled to a room temperature, 4,4'-diphenylmethane diisocyanate (MDI) as diisocyanate 180 mmol was added and the temperature was heated to 190° C. and reaction was carried out for 2 hours to obtain an NMP solution of polyamide imide resin. Next, YDCN-500-10 (manufactured by Tohto Kasei Co., Ltd.) as an epoxy resin was added in a proper amount so as to adjust the total solid content to be 10%, and further 2-ethyl-4-methylimidazole as a curing promoting agent was added in a proper amount of 1% by weight on the basis of the solid content of the epoxy resin and the resulting solution was diluted with dimethylacetamide to obtain thermosetting resin varnish (solid content 10%).

Comparative Example 1C

A substrate was produced in the same manner as Example 1C, except that the step of immersing the entire body of the core substrate was not immersed in the resin composition A.

Measurement of Sample for Adhesive Strength Evaluation

The adhesion force of a conductive circuit on a core substrate and an insulating layer layered on the conductor circuit were measured by a model experiment. The method will be described as follows.

Production of Evaluation Sample of Example 1C

MEC etch BOND CZ-8100 (trade name: manufactured by Mech Co., Ltd.) was sprayed at the solution temperature 35° C. and spraying pressure 0.15 MPa to both sides of MCL-E-679, which is a copper-clad laminated board, with a thickness of 0.6 μm to carry out surface-roughening of copper surface and form about 3 μm roughness and next, the resulting board was immersed in MEC etch BOND CZ-8300 (trade name: manufactured by Mech Co., Ltd.) at the solution temperature 25° C. for 20 seconds to carry out anti-rust treatment for the copper surface.

On the other hand, the bright surface (Rz=0.6 μm) of a 18 μm-thick copper foil was coated with the resin composition A. After the coating, the foil was dried at 160° C. for 1 minute so as to suppress the remaining solvent 1% or lower. The thickness of the applied resin composition was 2.0 μm.

Next the resin-coated face of the 18 μm-thick copper foil and the previously surface-treated MCL-E-679 FG were laminated through GEA-679-FG (trade names; manufactured by Hitachi Chemical Co., Ltd.), which are prepreg, and the resulting laminate was press-formed at 170° C. and 2.45 MPa for 1 hour and subjected to photolithographic treatment to obtain a sample having a conductor with 1 mm width for peel strength measurement.

Production of Evaluation Sample of Example 2C

A sample was produced in the same manner as the evaluation sample 1C for adhesion strength evaluation, except that in place of the resin composition A, the resin composition A-2 was applied to the bright face (Rz=0.6 μm) of the un-treated 18 μm-thick copper foil.

Production of Evaluation Sample of Example 3C

A sample was produced in the same manner as the evaluation sample 1C for adhesion strength evaluation, except that in place of the resin composition A, the resin composition A-3 was applied to the bright face (Rz=0.6 μm) of the un-treated 18 μm-thick copper foil.

Production of Evaluation Sample of Example 4C

A sample was produced in the same manner as the evaluation sample 1C for adhesion strength evaluation, except that in place of the resin composition A, the resin composition A-4 was applied to the bright face (Rz=0.6 μm) of the un-treated 18 μm-thick copper foil.

Production of Evaluation Sample of Comparative Example 1C

A sample was produced in the same manner as the evaluation sample 1C for adhesion strength evaluation, except that no resin composition A was applied.

Measurement of Conductor Peel Strength

The peel strengths of the conductors of the evaluation samples of Examples 1C to 4C and the comparative Example 1C were measured. The measurement method and the conditions were as those of Examples 1B to 5B and Comparative Examples 1B and 2B.

Measurement of Moisture Absorption Heat Resistant Test

The moisture absorption heat resistant test of the evaluation samples of Examples 1C to 4C and the comparative Example 1C was carried out. The measurement method and the conditions were as those of Examples 1B to 5B and Comparative Examples 1B and 2B, and blister occurrence the substrates was confirmed. The test of the evaluation samples was carried out by measuring the peel strength of the samples after 96 hour treatment.

Measurement of Connection Reliability

The connection reliability of the substrates of Examples 1C to 4C and the comparative Example 1C was evaluated. The connection reliability evaluation method was same as that in Examples 1B to 5B and Comparative Examples 1B and 2B Test Results The test results are shown in Table 10. The substrates and the evaluation samples produced in Examples 1C to 4C were found having conductor peel strength as high as 0.7 kN/m or higher in all cases; in an initial stage, after treatment at 150° C. for 240 hours, and after the moisture absorption heat resistance test. Further, no blister occurred after the moisture absorption heat resistance test, showing good connection reliability.

On the other hand, the substrate and the evaluation sample produced in Comparative Example 1C were found having weak conductor peel strength and causing blister between the inner conductor and the insulating layer after the moisture absorption heat resistance test. Also, no good connection reliability was obtained.

TABLE 10

| | Conductor Peel Strength (kN/m) | | | Blist | |
|---|---|---|---|---|---|
| | Initial Stage | After Treatment at 150° C. for 240 hours | After Moisture Absorption Heat Resistance Test | After Moisture Absorption Heat Resistance Test | Connection Reliability |
| Example 1 | 1.1 | 0.9 | 0.9 | None | Good |
| Example 2 | 1.1 | 0.8 | 0.8 | None | Good |
| Example 3 | 1.2 | 0.8 | 0.8 | None | Good |
| Example 4 | 1 | 0.7 | 0.7 | None | Good |
| Comparative Example 1 | 0.3 | 0.2 | 0 | Caused | Inferior |

According to the embodiments of the invention, without carrying out treatment of a conductor circuit, an inner conductor circuit treatment method giving good electric properties, suppressing risk of wiring unevenness and defects, and improving good reliability is provided.

It should be understood that the foregoing relates to only preferred embodiments of the invention, and it is intended to cover all changes and modifications of the examples of the invention herein chosen for the purposes of the disclosure, which do not constitute departures from the spirit and scope of the invention.

What is claimed is:

1. A printed wiring board having a conductor circuit comprising a copper layer adjacent to an insulating layer and an electroless gold plating, wherein the insulating layer has ten-point mean surface roughness (Rz) of 2.0 μm or less.

2. The printed wiring board according to claim 1, wherein the copper layer has a double-layer structure comprising a copper foil and electrolytic copper plating.

3. The printed wiring board according to claim 2, wherein the electrolytic copper plating is formed by patterned electrolytic copper plating.

4. The printed wiring board according to claim 1, wherein the copper layer has a triple-layer structure comprising a copper foil, an electroless copper plating, and an electrolytic copper plating.

5. The printed wiring board according to claim 1, wherein an electroless nickel plating exists immediately under the electroless gold plating.

6. The printed wiring board according to claim 1, wherein the minimum pitch of the conductor circuit is 80 μm or narrower.

7. The printed wiring board according to claim 1, wherein a face of the copper layer adjacent to the insulating layer has ten-point mean surface roughness (Rz) of 2.0 μm or less.

8. The printed wiring board according to claim 7, wherein said copper layer includes a copper foil adjacent the insulating layer, a face of the copper foil being said face of the copper layer adjacent the insulating layer, said face of the copper foil having said ten-point mean surface roughness (Rz) of 2.0 μm or less.

9. A multilayer wiring board comprising wiring as an inside layer of the multilayer wiring board, a polyamide imide resin layer on the wiring and an insulating layer as an outer layer of the multilayer wiring board, wherein the insulating layer is on the wiring via the polyamide imide resin layer, which contacts the wiring, and wherein a face of the wiring contacting the polyamide imide resin layer has ten-point roughness of 2.0 μm or less.

10. A printed wiring board having a conductor circuit comprising a copper layer contacting an insulating layer, wherein a face of the copper layer contacting the insulating layer has ten-point mean surface roughness (Rz) of 2.0 μm or less.

11. The printed wiring board according to claim 10, wherein said face of the copper layer having said ten-point mean surface roughness is a face of a copper foil.

12. The printed wiring board according to claim 10, wherein said conductor circuit further includes a gold layer on the copper layer.

13. The printed wiring board according to claim 12, wherein said gold layer includes an electroless gold plating.

14. A printed wiring board comprising a conductor circuit that includes a copper foil on a substrate, the substrate including an insulating layer, one face of the copper foil contacting the insulating layer, and a gold plating layer over the conductor circuit, wherein the one face of the copper foil has ten-point mean surface roughness (Rz) of 2.0 μm or less.

15. The printed wiring board according to claim 14, wherein said gold plating layer is an electrolessly deposited gold plating layer.

16. The printed wiring board according to claim 14, further comprising a nickel plating layer between the copper foil and the gold plating layer.

17. The printed wiring board according to claim 16, wherein said gold plating layer and said nickel plating layer are respectively an electroless gold plating layer and an electroless nickel plating layer.

18. Product formed by a production method of a printed wiring board comprising forming a circuit made from a copper foil on a substrate, the substrate including an insulating layer, one face of the copper foil contacting the insulating layer, and carrying out electroless gold plating on the circuit, wherein the one face of the copper foil has ten-point mean surface roughness (Rz) of 2.0 μm or less.

19. Product formed by a production method of a printed wiring board comprising forming a circuit made from a copper foil on a substrate, the substrate including an insulating layer, one face of the copper foil contacting the insulating layer, carrying out electroless nickel plating on the circuit, and then carrying out electroless gold plating on the circuit, wherein the one face of the copper foil has ten-point mean surface roughness (Rz) of 2.0 μm or less.

20. A printed wiring board having a conductor circuit comprising a copper layer contacting an insulating layer and an electroless gold plating, wherein a face of the copper layer contacting the insulating layer is not practically surface-roughened, wherein a minimum pitch of the conductor circuit is 80 μm or narrower, and wherein the face of the copper layer contacting the insulating layer has ten-point surface roughness of 2.0 μm or less.

21. A printed wiring board having a conductor circuit comprising a copper layer contacting an insulating layer and an electroless gold plating, wherein a face of the copper layer contacting the insulating layer is not practically surface-roughened, and wherein the insulating layer has ten-point means surface roughness (Rz) of 2.0 μm or less.

* * * * *